(12) United States Patent
Sekiguchi et al.

(10) Patent No.: US 7,193,884 B2
(45) Date of Patent: Mar. 20, 2007

(54) SEMICONDUCTOR MEMORY DEVICE

(75) Inventors: Tomonori Sekiguchi, Tama (JP);
Satoru Akiyama, Kawasaki (JP);
Riichiro Takemura, Tokyo (JP);
Satoru Hanzawa, Hachioji (JP);
Kazuhiko Kajigaya, Tokyo (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/280,170

(22) Filed: Nov. 17, 2005

(65) Prior Publication Data

US 2006/0158924 A1 Jul. 20, 2006

(30) Foreign Application Priority Data

Nov. 19, 2004 (JP) ............................. 2004-335886
Jun. 13, 2005 (JP) ............................. 2005-172077

(51) Int. Cl.
*G11C 11/24* (2006.01)

(52) U.S. Cl. .................... 365/149; 365/63; 365/230.06

(58) Field of Classification Search ................. 365/63, 365/149, 230.03, 230.06, 226, 189.09
See application file for complete search history.

(56) References Cited

U.S. PATENT DOCUMENTS 5,426,603 A * 6/1995 Nakamura et al. .......... 365/149
6,088,286 A 7/2000 Yamauchi et al.
6,545,923 B2 * 4/2003 Sim et al. .................... 365/204
7,035,128 B2 * 4/2006 Yamasaki et al. ........... 365/149
7,046,543 B2 * 5/2006 Arimoto et al. ............. 365/149

FOREIGN PATENT DOCUMENTS

JP 11-260054 9/1999

* cited by examiner

*Primary Examiner*—Gene N. Auduong
(74) *Attorney, Agent, or Firm*—Mattingly, Stanger, Malur & Brundidge, P.C.

(57) ABSTRACT

A write command is inputted from an outside, voltages of bit lines become VDL and VSS, and a voltage in accordance with a threshold voltage (LVT: low threshold voltage, MVT: mid threshold voltage, HVT: high threshold voltage) of a memory cell transistor is written into a storage node of a capacitor via the memory cell transistor. Thereafter, when a plate line connected to a plate side of the capacitor is driven from voltage VPL to voltage VPH and the voltage of the storage node is increased due to coupling, the voltage VDL of the bit line is reduced to the voltage VDP, and the voltage excessively written into the storage node is reduced in accordance with a level of a threshold voltage of the memory cell transistor, thereby reducing a variation in the voltage of the storage node due to a variation in the threshold voltage.

23 Claims, 22 Drawing Sheets

SEMICONDUCTOR MEMORY DEVICE

CROSS-REFERENCE TO RELATED APPLICATION

The present application claims priority from Japanese Patent Applications No. JP 2004-335886 filed on Nov. 19, 2004 and JP 2005-172077 filed on Jun. 13, 2005, the contents of which are hereby incorporated by reference into this application.

TECHNICAL FIELD OF THE INVENTION

The present invention relates to a semiconductor memory device such as a dynamic random access memory (DRAM). More particularly, the invention relates to a technology effectively applied to the semiconductor memory device, in which a plate electrode is driven so as to increase the amount of writing charge to a memory cell.

BACKGROUND OF THE INVENTION

According to the examination by the inventors of the present invention, the following micro-fabrication technology for DRAM is known.

In order to microfabricate and highly integrate the memory cells of DRAM, capacitors that realize a large capacity in a limited base area of the memory cells and miniaturized transistors are required. A serious problem at the time of microfabricating memory cell transistors is the thickness reduction of gate oxide. When a gate length of MOS transistors is shortened, it is necessary to reduce the thickness of the gate oxide in order to suppress a short channel effect.

In DRAM, however, since an N channel MOS transistor is used for a memory cell, a maximum writing voltage for an "H" side of a storage node is VPP–VT which is obtained when the voltage VPP on an "H" side of a word line to be applied to a gate of the memory cell transistor reduces by a threshold voltage VT, and the threshold voltage VT is not allowed to be reduced in order to maintain data retention characteristics. For this reason, the voltage of the word line cannot be readily reduced. Therefore, in comparison with the MOS transistors to be used for logic products, the thickness of the gate oxide of memory cell transistors is large, and thus the micro-fabrication thereof is difficult.

In order to solve such a problem, for example, Japanese Patent Application Laid-Open Publication No. 11-260054 (Patent Document 1) discloses DRAM in which a plate electrode of a memory cell is driven to increase the writing voltage to the memory cell. In this method, the voltage on the "H" side of a word line is reduced. By doing so, the problem that the writing of the "H" side data becomes insufficient is compensated by driving a plate electrode. As a result, since the thickness of a gate oxide of a memory cell transistor can be reduced, the memory cell can be microfabricated.

SUMMARY OF THE INVENTION

Incidentally, as a result of the examination for the microfabrication of DRAM by the inventors of the present invention, the followings become apparent.

For example, the technology in the Patent Document 1 has the following problem. In the miniaturized transistor to be used for the memory cell, the threshold voltage VT varies widely, and a range of the variation becomes nearly 1 V in DRAM with large capacity. When a plate is driven in the case where the threshold voltage of the memory cells varies widely, the voltage to be written into the memory cells varies widely. More specifically, when amplitude of a plate is increased in order to write a voltage sufficiently into a cell with a large threshold voltage, an excessively high voltage is written into a cell with a low threshold voltage, and as a result, reliability of the memory transistor is degraded.

This problem will be described with reference to FIG. 20 and FIG. 21. FIG. 20 is a circuit diagram illustrating a configuration example of a part of a DRAM memory array in which a plate is driven in a semiconductor memory device examined as a premise of the present invention. FIG. 21 is an operation waveform diagram illustrating one example of the operation in the semiconductor memory device of FIG. 20.

The DRAM memory array shown in FIG. 20 includes a word line WL0 driven by a main word line MWLB or a sub-word driver selection line FX, bit lines BLT and BLB, a memory cell which is disposed at an intersection between the word line WL0 and the bit line BLT, a sense amplifier SA disposed between the bit lines BLT and BLB, and the like. The memory cell includes a memory cell transistor and a capacitor Cs, and one end of the capacitor Cs (on the side of the memory cell transistor) is a storage node SN and the other end thereof is a plate line PL.

The sense amplifier SA includes a transfer gate TGC driven by sense amplifier isolation signals SHR0 and SHR1, a reading/writing port IOP which connects the bit lines BLT and BLB to a local IO line pair (LIO line pair) by a column selection line YS, a precharge circuit PCC which precharges the bit lines BLT and BLB by means of the activation of a precharge signal BLEQ, and a cross-coupled amplifier CC which amplifies a voltage difference between the bit lines BLT and BLB by driving a common source line of PMOS CSP and a common source line of NMOS CSN. Note that, although a part of the configuration is shown here, the actual DRAM memory array includes a lot of memory cells, sense amplifiers SA and the like.

For example, an operation as shown in FIG. 21 is performed in this configuration. When a bank activation command ACT is inputted from an outside of a chip, one signal SHR1 of the sense amplifier isolation signals SHR and the precharge signal BLEQ are deactivated in the sense amplifier SA specified by an address. When the main word line MWLB is reduced to VKK in a row decoder and the sub-word driver selection line FX is activated in an array control circuit, the selected word line WL0 is activated from VKK to VPP. VKK is a power supply voltage on a low-level side of the word line generated by a negative power supply voltage generating circuit, and VPP is a power supply voltage on a high-level side.

In the memory cell selected by the word line WL0, the memory cell transistor becomes conductive, and a signal is read onto the bit line BLT. FIG. 21 illustrates an example in which a ground voltage VSS is written into the memory cell and "L" signal is generated. Thereafter, in the sense amplifier SA, the common source line of PMOS CSP is driven to VDL and the common source line of NMOS CSN is driven to the ground voltage VSS, and the signals on the bit lines BLT and BLB are amplified. In this state, the memory chip can receive a read command RD or a write command WRT. FIG. 21 illustrates the case where the write command WRT is inputted.

In this manner, the column selection line YS with the selected address is activated, and the write data is written from the LIO line pair. A waveform at the time of inverse writing in which the bit line BLT is driven to "H" is shown here.

Thereafter, the voltage of the plate line PL of the selected memory cell falls from VPH to VPL. Since the memory cell transistor is an N channel MOS transistor, the maximum voltage which can be written to the storage node SN becomes VPP−VT when the threshold voltage is VT. In this DRAM memory array, the "H" level VPP of the word line is reduced to about the power supply voltage VDD (for example, 1.8 V). Further, since a lot of miniaturized transistors are used as the memory cell transistors, the variation in the threshold voltage VT is very large and is nearly 1V. For example, when a design center value is set to 0.7 V, the minimum value of the threshold voltage VT becomes 0.2 V and the maximum value thereof becomes 1.2 V.

Then, when the bit line voltage VDL is set to, for example, 1.3 V, since VPP−VT=1.6 V in the memory cell with low threshold voltage (LVT-cell), the memory cell transistor is ON, and VDL of 1.3 V is written into the storage node SN. In the memory cell with intermediate threshold voltage (MVT-cell) and a memory cell with high threshold voltage (HVT-cell), however, the memory cell transistors are cut off during the amplification, only voltages of up to 1.1 V and 0.6 V are written into the respective storage nodes SN. More specifically, the voltage in the storage nodes SN at the time of writing varies in a range of 0.6 V to 1.3 V in accordance with the threshold voltage VT of the memory cell transistors.

In this state, after the precharge command PRC is inputted, when the voltage of the plate line PL of the selected memory cell is returned from VPL to VPH, the voltage of the storage node SN increases by ΔPL (=VPH−VPL) due to the coupling from the capacitor Cs. Since the memory cell transistor is cut off or a conductance is very small in the memory cell into which "H" is written, the increased voltage ΔPL is retained. However, since the memory cell transistor is in a sufficiently ON state in the memory cell into which "L" is written, the voltage is returned to the ground voltage VSS immediately. Therefore, the amount of the accumulated charge can be increased by ΔPL.

When ΔPL is set to, for example, 0.7 V so that the writing voltage of the memory cell with the highest threshold voltage (HVT-cell) is increased to VDL, voltages of 1.3 V or higher are written into all the memory cells. Therefore, the reading signal amount and a margin for retention time in a next cycle can be increased. However, since voltage VDL of up to 1.3 V can be originally written into the cell with low threshold voltage (LVT-cell), it is increased up to 2.0 V when the voltage further increases by ΔPL. If the word line is deactivated in this state, a high voltage is still applied to the memory cell transistor at the time of standby. For this reason, the reliability of the device is degraded, and the micro-fabrication of the memory cell transistor becomes difficult.

In order to solve the above problems, an object of the present invention is to provide a semiconductor memory device, which is useful particularly for micro-fabrication of DRAM.

The above and other objects and novel characteristics of the present invention will be apparent from the description of this specification and the accompanying drawings.

The typical ones of the inventions disclosed in this application will be briefly described as follows.

A semiconductor memory device according to the present invention comprises: a plurality of memory cells each having a MOS transistor and a capacitor, in which a gate of the MOS transistor is a selection terminal, one of source and drain of the MOS transistor is an I/O terminal, and the other of the source and drain is connected to a storage node of the capacitor; a plurality of word lines respectively connected to the selection terminals of the plurality of memory cells; complementary bit lines respectively connected to the I/O terminals of the plurality of memory cells; sense amplifiers which are connected to one ends of the complementary bit lines and amplify a voltage difference between the complementary bit lines to latch the amplified voltage; and means which, after one of the plurality of word lines is activated and at the time when the sense amplifier is activated, one of the complementary bit lines is amplified to a first voltage, and the other complementary bit line is amplified to a second voltage lower than the first voltage, reduces the voltage of the complementary bit line amplified to the first voltage to a third voltage lower than the first voltage at a first time and then deactivates the one of word lines.

More specifically, in a DRAM memory cell, the amount of writing (including rewriting) charges varies in some cases due to a variation in a threshold voltage of an MOS transistor (memory cell transistor), and this variation in the amount of the writing charges is reduced by discharging excessive writing charges in a final phase of the writing before the word lines are deactivated. As a result, problems of reliability such as durability of elements, breakdown voltage and leakage which are caused by excessive writing charges can be solved, and thus the micro-fabrication of the semiconductor memory device can be realized.

Herein, the sense amplifier can be a so-called cross-coupled amplifier, and in this case, the above-mentioned means can be realized by reducing the first voltage of the common source node of PMOS in the cross-coupled amplifier to the fourth voltage lower than the first voltage. Further, the first time can be later than the time at which a precharge command is inputted into the semiconductor memory device. That is, the excessive writing charges into the storage node are discharged in a short time just before the word lines are deactivated, so as to adjust the writing charges.

The above-mentioned means can be used in combination with a so-called overdrive of the sense amplifier. In this case, after the word lines are activated, the common source line of PMOS is driven to a fifth voltage higher than the first voltage, and then is driven to the first voltage and further to the fourth voltage.

Also, a semiconductor memory device according to the present invention comprises: a plurality of memory cells each having a MOS transistor and a capacitor, in which a gate of the MOS transistor is a selection terminal, one of source and drain of the MOS transistor is an I/O terminal, and the other of the source and drain is connected to a storage node of the capacitor; a plurality of word lines respectively connected to the selection terminals of the plurality of memory cells; complementary bit lines respectively connected to the I/O terminals of the plurality of memory cells; a plurality of plate lines respectively connected to terminals on an opposite side of the storage nodes of the capacitors in the plurality of memory cells; sense amplifiers which are connected to one ends of the complementary bit lines and amplify a voltage difference between the complementary bit lines to latch the amplified voltage; means which, after one of the plurality of word lines is activated and at the time when the sense amplifier is activated, one of the complementary bit lines is amplified to a first voltage, and the other complementary bit line is amplified to a second voltage lower than the first voltage, drives a plate line corresponding to the one of word lines from a sixth voltage to a seventh voltage higher than the sixth voltage at a second time; and means which reduces the voltage of the bit line amplified to the first voltage to a third voltage lower than the first voltage at a first time and then deactivates the one of word lines.

That is, particularly in the case of the DRAM memory cell adopting the plate driven scheme in which the plate lines are driven, the excessive writing charges as mentioned above are frequently generated. Such excessive writing charges become the factors to deteriorate the reliability of the device in the micro-fabrication. However, such a problem can be solved by providing the means as described above.

A semiconductor memory device according to the present invention comprises: a plurality of memory cells each having a MOS transistor and a capacitor, in which a gate of the MOS transistor is a selection terminal, one of source and drain of the MOS transistor is an I/O terminal, and the other of the source and drain is connected to a storage node of the capacitor; a plurality of word lines respectively connected to the selection terminals of the plurality of memory cells; complementary bit lines respectively connected to the I/O terminals of the plurality of memory cells; sense amplifiers which are connected to one ends of the complementary bit lines and amplify a voltage difference between the complementary bit lines to latch the amplified voltage; a common source line of PMOS and a common source line of NMOS connected to the sense amplifier; and first, second and third drivers which drive the common source line of PMOS, wherein the sense amplifier is a cross-coupled amplifier, and the first driver is connected to a first power supply voltage, the second driver is connected to a fourth power supply voltage, and the third driver is connected to a fifth power supply voltage.

Herein, the fourth power supply voltage can be lower than a half of the first power supply voltage. More specifically, the first power supply voltage is a writing voltage VDL on the "H" side of the complementary bit lines, and the fourth power supply voltage is used when the excessive writing charges are discharged. In an actual case, it is preferable that, by setting the voltage to a value lower than VDL/2, the voltage on the "H" side of the bit line is reduced at high speed so as to discharge the excessive writing charges present in the storage node at high speed. Note that, in an actual case, since the voltage of the bit line is not decreased to lower than the threshold voltage due to an influence of the threshold voltage of a P channel MOS transistor of the cross-coupled amplifier, the fourth power supply voltage can be ground voltage VSS (0V) without any problems. Further, the fifth power supply voltage is, for example, a voltage for the overdrive of the sense amplifier.

The effect obtained by typical aspects of the present invention is that it is possible to realize the micro-fabrication of a semiconductor memory device.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1A:
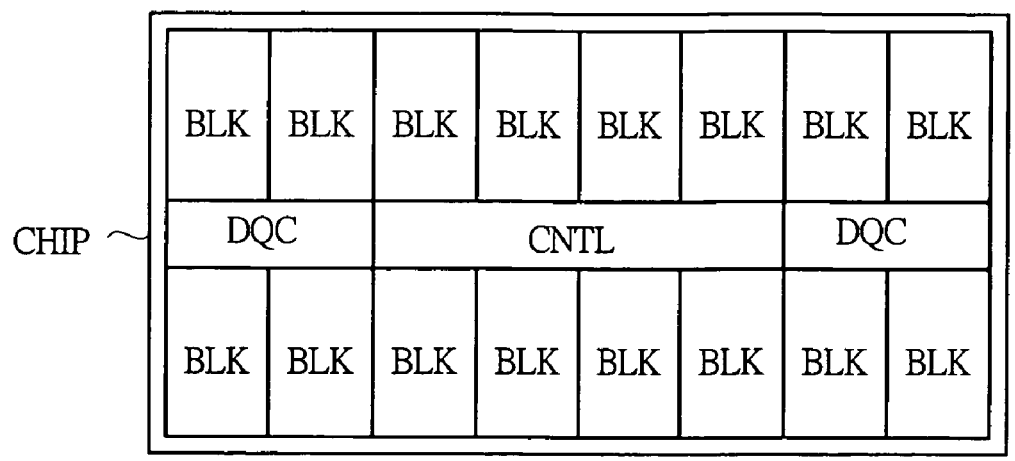
FIG. 1A is a plan view illustrating one configuration example of an entire chip in a semiconductor memory device according to one embodiment of the present invention.
Figure 1B:
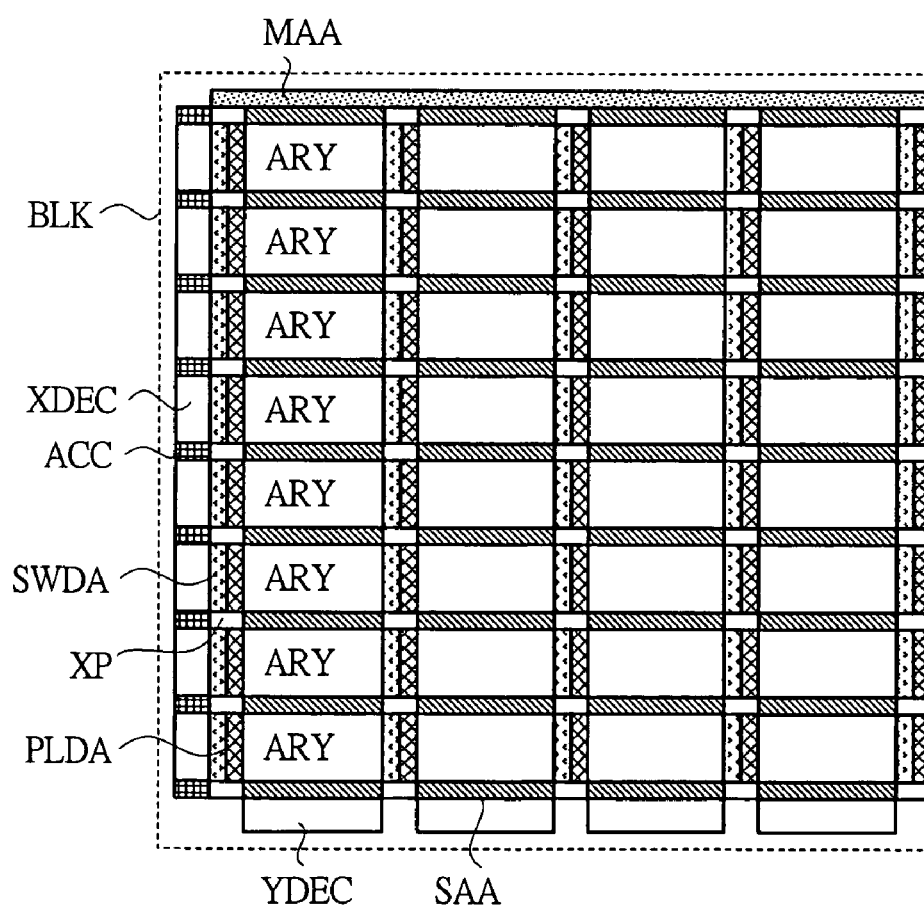
FIG. 1B is a plan view illustrating one configuration example of a memory block in FIG. 1A in a semiconductor memory device according to one embodiment of the present invention.

FIG. 1 1A and FIG. 1B are plan views showing examples of the chip configuration in the semiconductor memory device according to the present invention, in which FIG. 1 is a plan view illustrating one configuration example of an entire chip and FIG. 1B is a plan view illustrating one configuration example of memory blocks in FIG. 1A.

The semiconductor memory device shown in FIG. 1A and FIG. 1B is a DRAM adopting a plate driven scheme. An entire configuration of a memory chip CHIP is, as shown in FIG. 1A for example, roughly divided into a control circuit CNTL, I/O circuits DQC and memory blocks BLK. A clock, an address and a control signal are inputted into the control circuit CNTL from the outside of the memory chip CHIP, and an operation mode of the memory chip CHIP is determined and the predecode of an address is performed. The I/O circuits DQC have an I/O buffer and the like, and write data is inputted from the outside of the memory chip CHIP and read data are outputted to the outside of the memory chip CHIP.

In the memory block BLK, as shown in FIG. 1B for example, a plurality of memory arrays ARY are arranged, and sense amplifier rows SAA, sub-word driver rows SWDA, plate driver rows PLDA and cross areas XP are arranged around the memory arrays ARY. Further, on an outer periphery of the memory block BLK, column decoders YDEC and a main amplifier row MAA are arranged in parallel with the sense amplifier rows SAA, and row decoders XDEC and array control circuits ACC are arranged in parallel with the sub-word driver rows SWDA.

Figure 2:
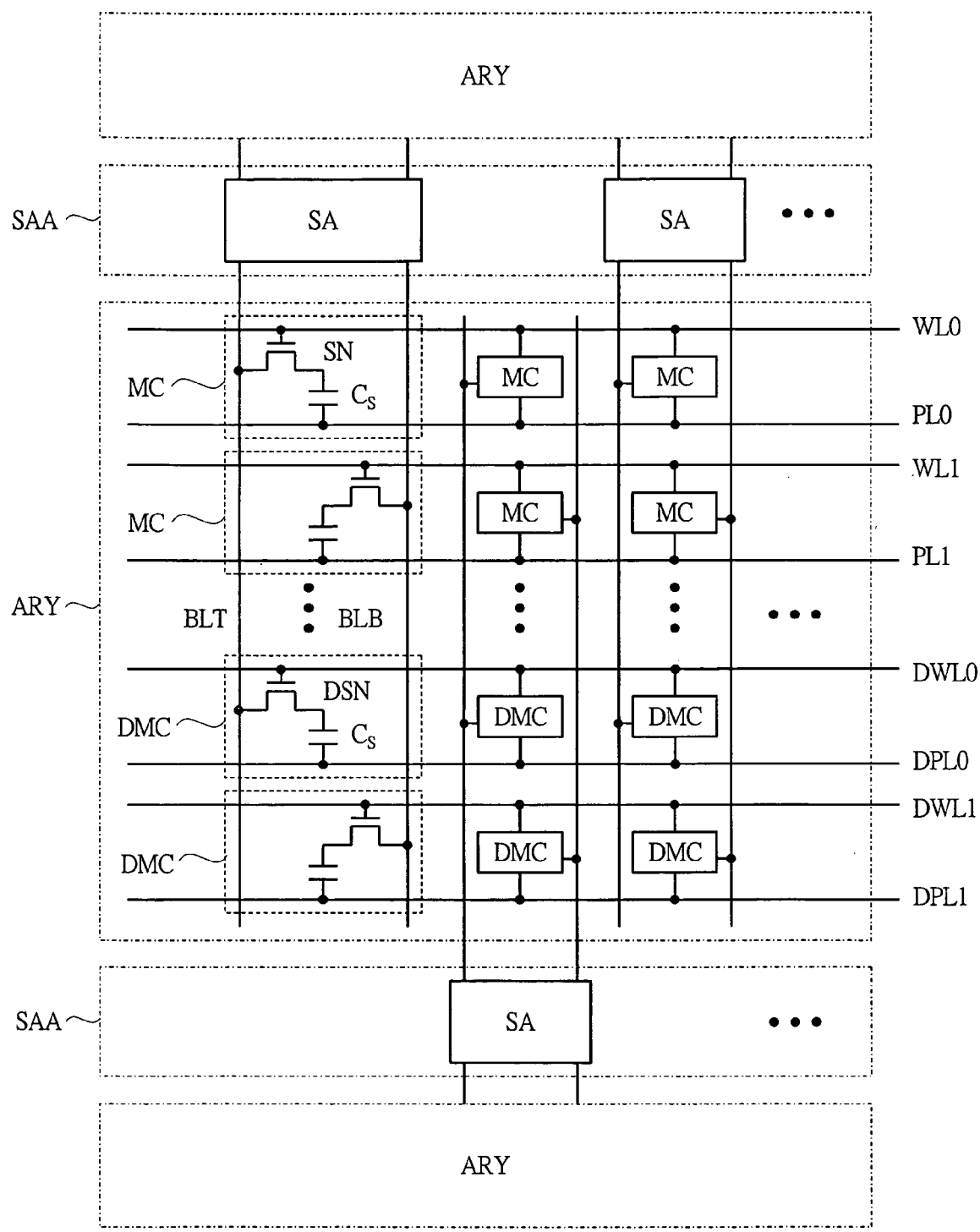
FIG. 2 is a circuit diagram illustrating one configuration example of memory arrays and sense amplifier rows in the semiconductor memory device in FIG. 1A and FIG. 1B.

FIG. 2 is a circuit diagram illustrating one example of a configuration of the memory arrays and the sense amplifier rows in the semiconductor memory device in FIG. 1A and FIG. 1B. As shown in FIG. 2, the memory array ARY is composed of a plurality of memory cells MC. The memory cells MC are DRAM memory cells, and each memory cell is composed of one MOS transistor (memory cell transistor) and one capacitor Cs. One of a source and drain of the MOS transistor is connected to a bit line BLT or a bit line BLB, the other one thereof is connected to a storage node SN, and a gate thereof is connected to a word line WL.

One terminal of the capacitor Cs is connected to the storage node SN, and the other terminal is connected to a plate line PL arranged in parallel with the word line WL. The bit lines BLT and BLB serve as a bit line pair (complementary bit line) BLT/B.

It is preferable that, different from normal DRAM, the plate line PL is divided for each one word line WL and the divided plate lines PL are arranged in parallel with the word lines WL so that only the plate line PL of the memory cell MC where the word line WL is activated is driven. By doing so, while disturbance on the other memory cells MC in a non-selected state due to the driving of the plate line PL is being reduced, voltages of the storage nodes SN can be increased. Further, the memory array ARY includes dummy memory cells DMC which have the similar configuration to those of the memory cells MC. The dummy memory cells DMC are connected to dummy word lines DWL and dummy plate lines DPL, and are used for generating reference signals at the time of reading.

Figure 3:
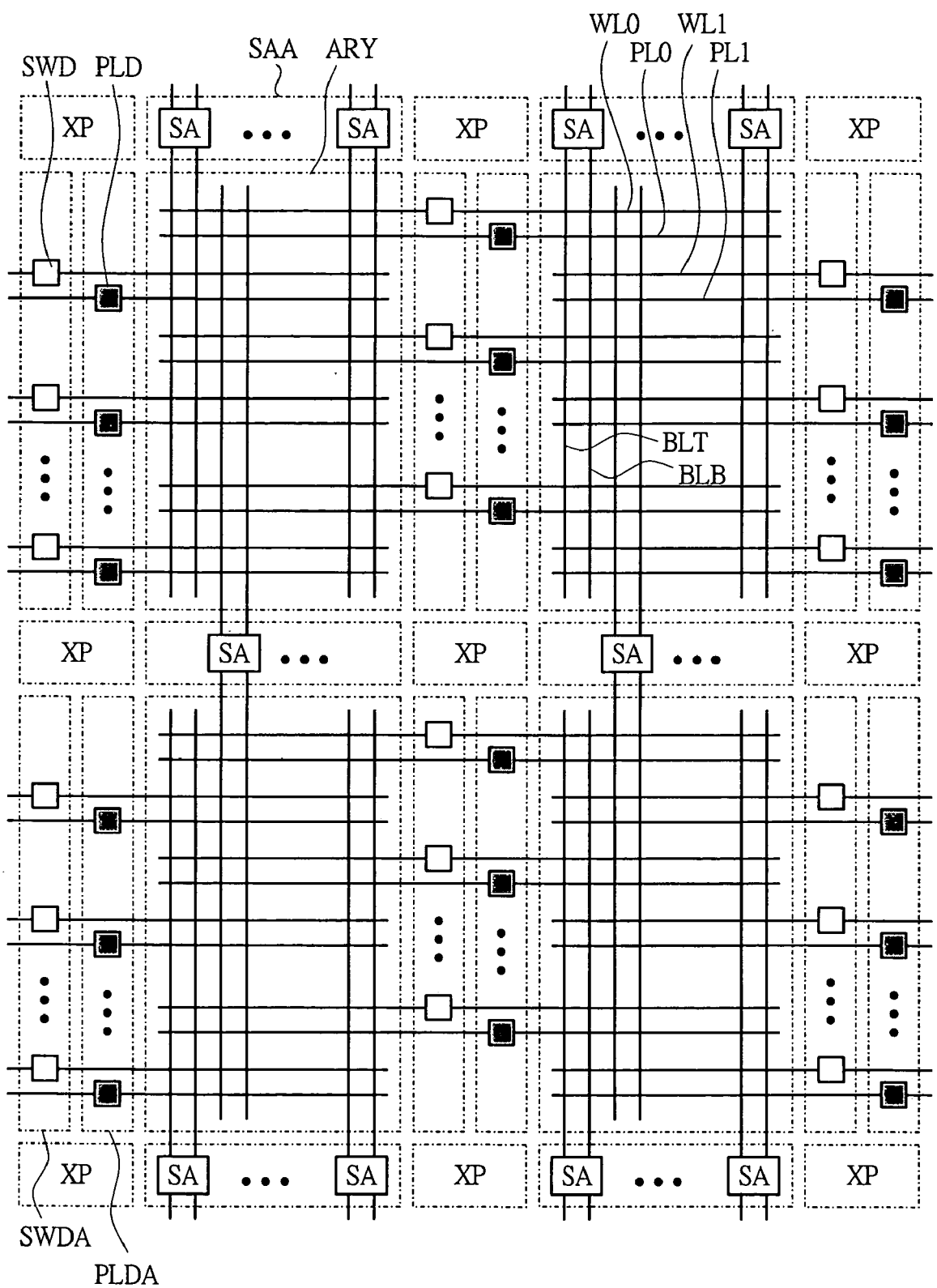
FIG. 3 is a plan view illustrating one example of a detailed arrangement relationship among the sense amplifier rows, sub-word driver rows and plate driver rows in the semiconductor memory device in FIG. 1A and FIG. 1B.

FIG. 3 is a plan view illustrating one example of a detailed arrangement relationship among the sense amplifier rows, sub-word driver rows and plate driver rows in the semiconductor memory device in FIG. 1A and FIG. 1B. As shown in FIG. 3, the sense amplifiers SA in the sense amplifier rows SAA are arranged alternately above and below the memory arrays ARY, and are connected in common to the bit line pairs BLT/B in the memory array ARY.

Similarly, sub-word drivers SWD in the sub-word driver rows SWDA and plate drivers PLD in the plate driver rows PLDA are respectively arranged alternately on the right and left of the memory arrays ARY, and are connected in common to the word lines WL and the plate lines PL in the right and left memory arrays ARY. With such arrangements, in the sub-word driver rows SWDA and the plate driver rows PLDA, pitches between the sub-word drivers SWD and between the plate drivers PLD can be widened two times as wide as pitches between the word lines WL and between the plate lines PL in the memory arrays ARY. Therefore, the micro-fabrication is facilitated.

Figure 4:
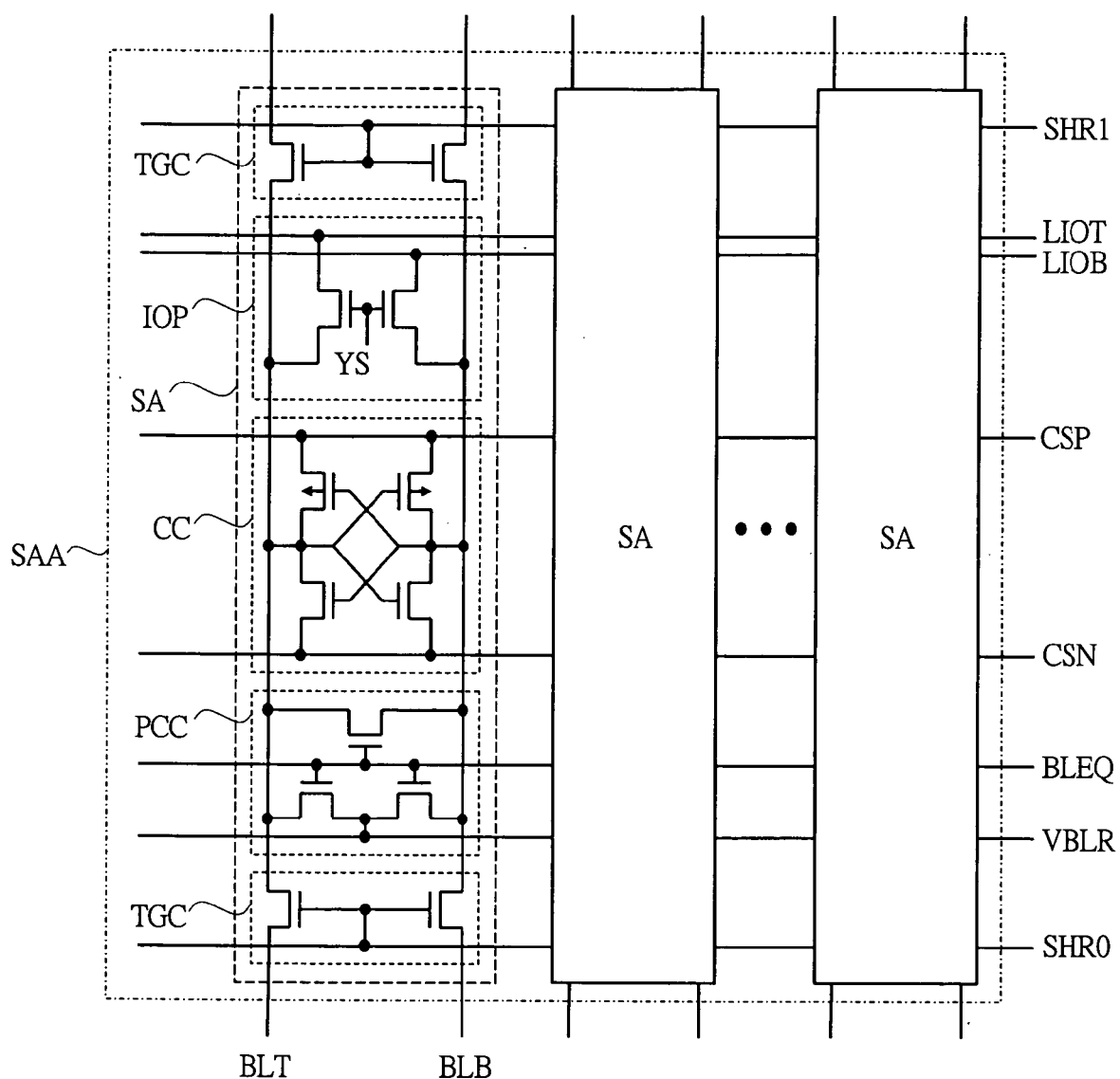
FIG. 4 is a circuit diagram illustrating one example of a detailed configuration of the sense amplifier rows in the semiconductor memory device in FIG. 2.

FIG. 4 is a circuit diagram illustrating one example of a detailed configuration of the sense amplifier row in the semiconductor memory device in FIG. 2. As shown in FIG. 4, a plurality of sense amplifiers SA are arranged in the sense amplifier row SAA, and the respective sense amplifiers SA are connected in common to the bit line pairs BLT/B in the memory arrays ARY which are adjacent to the sense amplifiers SA on both sides. Each of the sense amplifiers SA includes a transfer gate TGC, a precharge circuit PCC, a cross-coupled amplifier CC and a reading/writing port IOP.

The transfer gate TGC is a circuit that connects the sense amplifier SA and the memory array ARY when a sense amplifier isolation signal (SHR signal) is activated. The precharge circuit PCC equalizes the pair of the bit lines BLT and BLB when a bit line precharge signal (BLEQ signal) is activated, and precharges them to a bit line precharge level VBLR. The bit line precharge level VBLR is normally set to a midpoint VDL/2 of a voltage VDL with bit line amplitude (the same level as a power supply voltage VCC from the outside of the chip or a level obtained by decreasing it).

After a minute reading signal is generated on the bit lines BLT and BLB from the memory cell MC and the dummy memory cell DMC, the cross-coupled amplifier CC drives a common source line of PMOS CSP to a voltage VDL and drives a common source line of NMOS CSN to a ground voltage VSS, and then, it amplifies one of the bit lines BLT and BLB with higher voltage to the voltage VDL and the other of bit lines BLT and BLB with lower voltage to the voltage VSS, so as to latch the amplified voltage. The reading/writing port IOP is a circuit that connects local IO lines (LIO lines) LIOT/B and the bit line pair BLT/B when the column selection line YS is activated. Note that, the LIO lines LIOT/B are retained at a precharge level at the time of standby in order to prevent current consumption in the non-selected sense amplifier row SAA.

Figure 5:
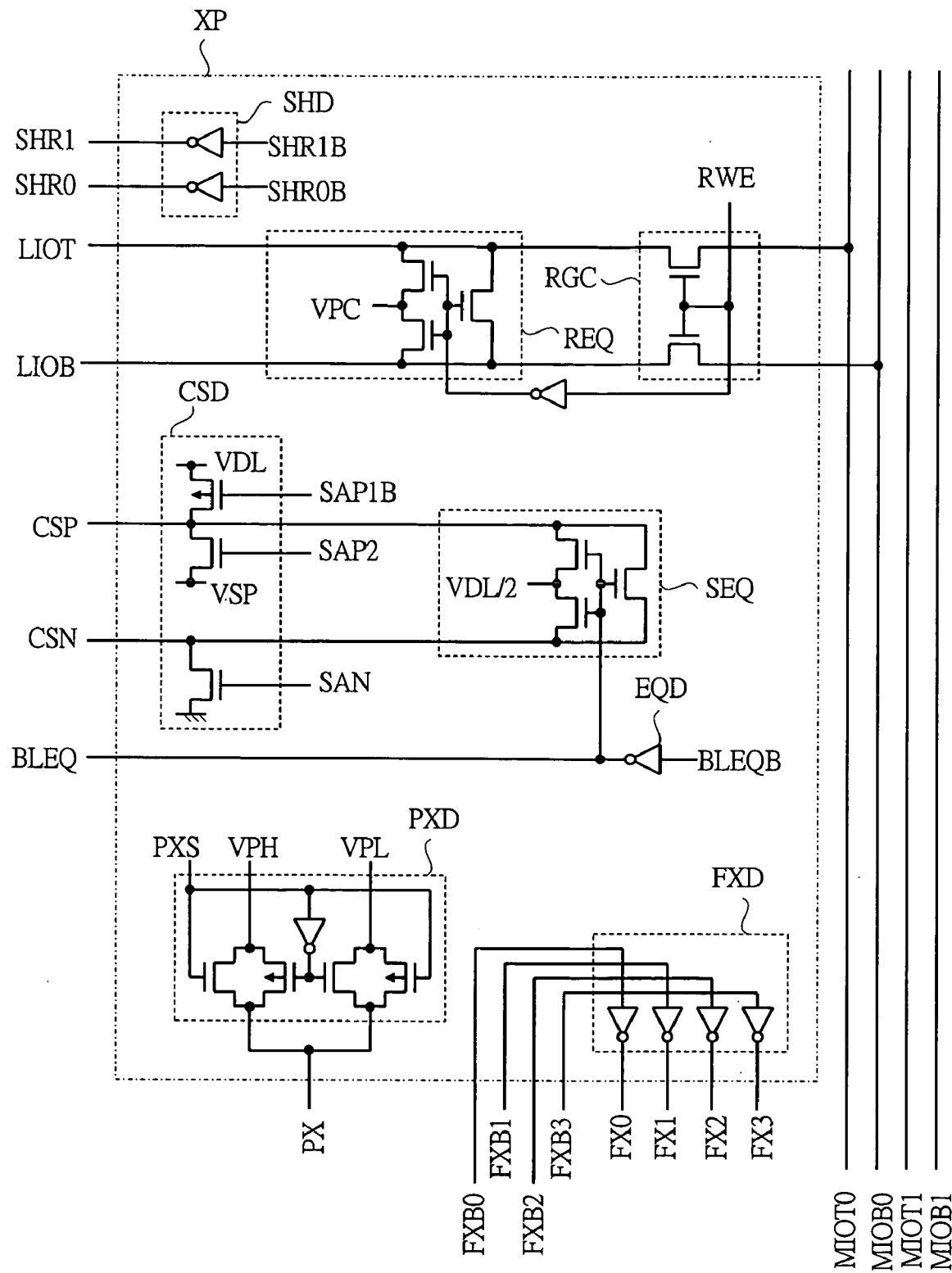
FIG. 5 is a circuit diagram illustrating one example of a configuration of a cross area in the semiconductor memory device in FIG. 1A and FIG. 1B.

FIG. 5 is a circuit diagram illustrating one example of a configuration of the cross area in the semiconductor memory device in FIG. 1A and FIG. 1B. The cross area XP includes an SHR signal driver SHD, an LIO line precharge circuit REQ, a read/write gate RGC, a CS line driver CSD, a CS line precharge circuit SEQ, a BLEQ signal driver EQD, an FX line driver FXD and a PX line driver PXD.

A complementary signal SHRB of an SHR signal is inputted into the SHR signal driver SHD, and its inverted signal is outputted. When a read/write enable signal RWE is in a deactivated state, namely, in a VSS level, the LIO line precharge circuit REQ precharges the LIO lines LIOT/B to a voltage VPC. The read/write gate RGC is a circuit that connects the LIO lines LIOT/B and the main IO lines MIOT/B when the read/write enable signal RWE is in an activated state, namely, has a voltage VCL (used as a power supply voltage for a peripheral circuit at the same level as the external VCC level or the level obtained by decreasing it).

The CS line driver CSD is the circuit that drives the common source line of NMOS CSN to the ground voltage VSS when the sense amplifier enable signal of NMOS SAN is in an activated state, drives the common source line of PMOS CSP to the voltage VDL ("H" level of the bit line) when a first sense amplifier enable signal of PMOS SAP1B is in an activated state (VSS level), and drives the common source line of PMOS CSP to the voltage VSP when a second sense amplifier enable signal of PMOS SAP2 is in an activated state (VCL level).

In this case, a P channel MOS transistor is used as a circuit that drives the common source line of PMOS CSP to voltage VDL, and an N channel MOS transistor is used as a circuit that drives the common source line of NMOS CSN to voltage VSP. Since the circuit for driving to voltage VSP mentioned later is for temporarily decreasing a bit line voltage on an "H" side at the time of writing, the N channel MOS transistor is used for it. As a result, the bit line voltage can be decreased at high speed. However, it is also possible to use a P channel MOS transistor to form it.

As described above, the present invention is characterized in that a function by which the level of the common source line of PMOS CSP where the sense amplifier SA is activated can be set to two kinds of voltages VDL and VSP is provided in the CS line driver CSD. At this time, when the CS line driver CSD is arranged in the cross area XP, there is an advantage that the area of the sense amplifier SA does not increase.

The CS line precharge circuit SEQ is a circuit that precharges the common source lines of PMOS and NMOS CSP and CSN to VDL/2 when the BLEQ signal is activated. The BLEQ signal driver EQD inputs a complementary signal BLEQB of the precharge signal BLEQ and outputs its inverted signal. The FX line driver FXD inputs a signal FXB and outputs its complementary signal to a sub-word driver selection line FX (FX line).

The PX line driver PXD inputs a plate timing signal PXS with voltage VCL amplitude and outputs a voltage to the plate control line (PX line). The PX line is the line for driving the plate line PL. When the plate timing signal PXS is deactivated, the plate voltage VPH at the normal time is outputted to the PX line. On the other hand, when the plate timing signal PXS is activated, the plate voltage VPL is outputted to the PX line. Note that, by providing the PX line driver PXD in the cross area XP, a delay of the PX line can be reduced.

Figure 6:
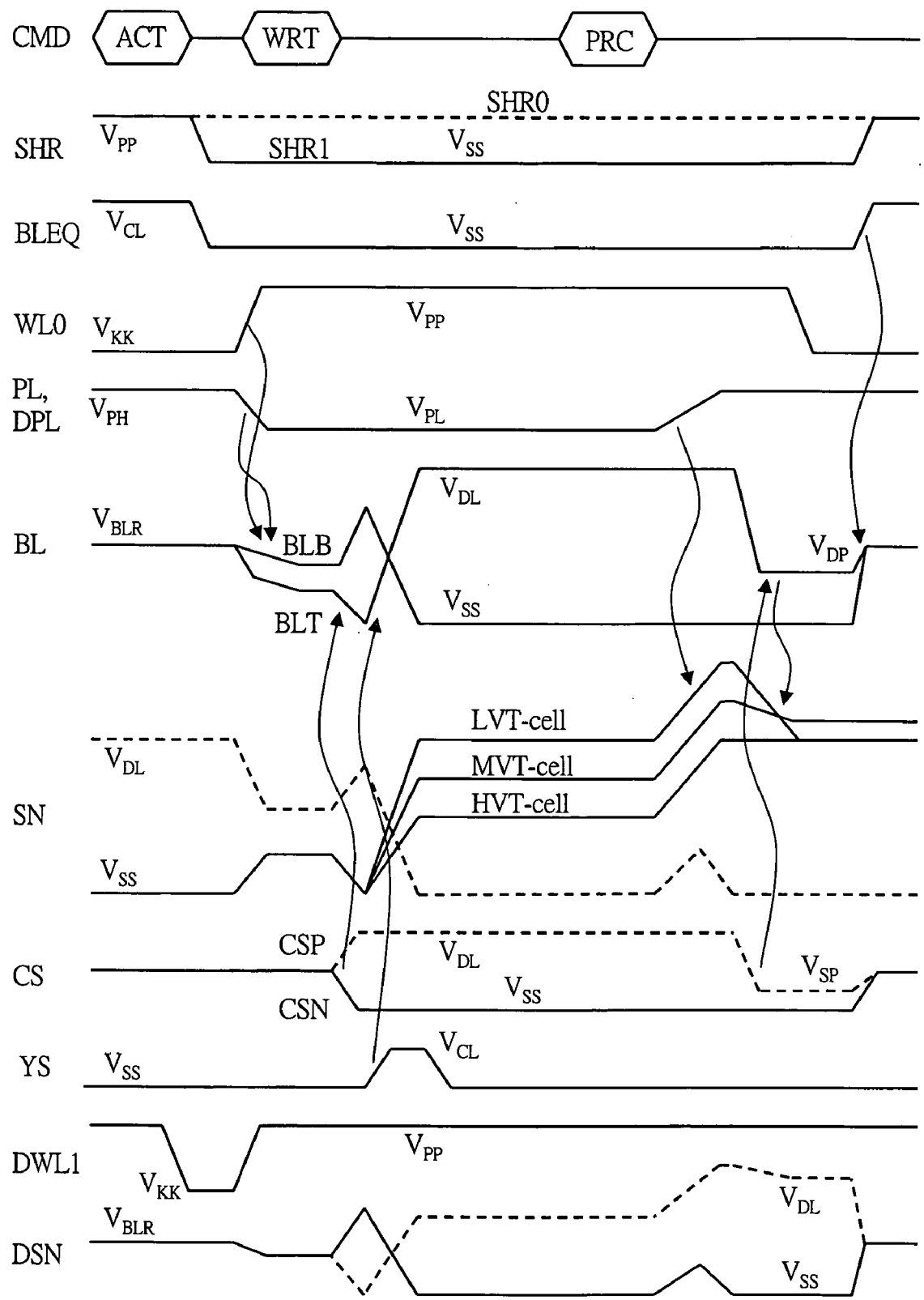
FIG. 6 is an operation waveform diagram illustrating one example of the operation in the semiconductor memory device in FIG. 1A and FIG. 1B.

An operation of the semiconductor memory device will be described below. FIG. 6 is an operation waveform diagram illustrating one example of the operation in the semiconductor memory device in FIG. 1A and FIG. 1B.

As shown in FIG. 6, when a bank activation command ACT is inputted from the outside of the memory chip, one SHR signal and the BLEQ signal are deactivated in the sense amplifier row SAA specified by an address. Also, a dummy word line DWL1 of the dummy cell DMC which is in VPP level in the activated state is deactivated and returned to a VKK level. VKK is a power supply voltage on a low level side of the word line, which is generated from a negative power supply generating circuit. As described above, by setting the level of the word line at the deactivated time to be lower than the ground voltage VSS, a threshold voltage of the memory cell transistor can be set to a lower value, and the level VPP on the "H" side of the word line can be reduced.

Thereafter, when the main word line MWLB decreases to voltage VKK in the row decoder XDEC and the FX line is activated in the array control circuit ACC, the selected word line WL0 is activated to the voltage VPP. The memory cell transistor becomes conductive in the memory cell MC selected by the word line WL0, and a signal is read onto the bit line BLT. FIG. 6 illustrates the example where the ground voltage VSS is written into the memory cell MC in advance and an "L" signal is generated. Further, also the dummy word line DWL1 is activated simultaneously with the activation of the word line WL0, and a reference signal is generated onto the bit line BLB from the dummy memory cell DMC in which the precharge voltage VBLR is written.

At this time, the voltage VPH falls to voltage VPL in the plate line PL0 of the selected memory cell MC and the plate line DPL1 of the corresponding dummy memory cell DMC. When the plate line PL0 is driven in such a manner, the voltage level reduces in the storage node SN of the selected memory cell MC and the dummy storage node DSN of the dummy memory cell DMC due to the coupling via the capacitor Cs, and thus, respective accumulated charges are read onto the bit lines BLT and BLB at high speed. When the voltage VPH is set to a middle value between the voltage VDL and the ground voltage VSS, a voltage to be applied to a capacitor dielectric film of the memory cell becomes low at the time of standby, and the reliability is improved.

Thereafter, the common source line of PMOS CSP is driven to voltage VDL and the common source line of NMOS CSN is driven to ground voltage VSS in the sense amplifier SA, and a voltage difference between the bit lines BLT and BLB is amplified. In this state, the memory chip can receive a read command RD or a write command WRT. FIG. 6 illustrates the case where the write command WRT is inputted. The column selection line YS with selected address is activated, and write data is written from the LIO lines LIOT/B. In this case, waveforms at the time of inverse writing in which the bit line BLT is driven to "H" are shown.

Since the memory cell transistor is the N channel MOS transistor, when the threshold voltage is set to VT, the maximum voltage which can be written into the storage node SN becomes VPP−VT. In the memory chip of the present invention, in order to reduce the thickness of a gate oxide of the memory cell transistor, the "H" level voltage VPP of the word line is reduced to be close to the power supply voltage VDD (for example, 1.8 V). Also, since a miniaturized transistor is used as the memory cell transistor and the number thereof is large, the variation in the threshold voltage VT is very large and is nearly 1V, and when a design center value is, for example, 0.7 V, the minimum value is 0.2 V and the maximum value is 1.2 V.

As a result, when the bit line voltage VDL is set to 1.3 V for example, since VPP−VT=1.6 V in the memory cell with low threshold voltage VT (LVT-cell), the memory cell transistor is ON, and thus VDL of 1.3 can be written into the storage node SN. On the other hand, the memory cell transistor is in a cut-off state during amplification in the memory cell with the intermediate threshold voltage VT (MVT-cell) and the memory cell wit the high threshold voltage VT (HVT-cell), and thus only the voltages of up to 1.1 V and 0.6 V are written into the respective storage nodes NS. More specifically, the voltage of the storage node SN at the time of writing has the variation in the range of 0.6 V to 1.3 V in accordance with the threshold voltage VT of the memory cell transistor.

In this state, when the precharge command PRC is inputted and the voltage VPL is returned to the voltage VPH in the plate line PL0 of the selected memory cell MC and the dummy plate line DPL1 of the dummy memory cell DMC, the voltages of the storage nodes SN and DSN increase by ΔPL (=VPH−VPL) due to the coupling from the capacitors Cs. At this time, since the memory cell transistor is cut off or a conductance is high in the memory cell MC into which "H" is written, the increased voltage ΔPL is retained, but since the memory cell transistor is in a sufficiently ON state in the memory cell MC into which "L" is written, the voltage is returned to the ground voltage VSS immediately. Therefore, the accumulated amount of charges of the storage node SN in the memory cell MC can be increased by ΔPL.

When ΔPL is set to, for example, 0.7 V so that the writing voltage of the memory cell with the highest threshold voltage VT (HVT-cell) increases to VDL, 1.3 V or higher is written into all the memory cells MC. Therefore, the reading signal amount and a margin for retention time in a next cycle can be increased. However, since VDL of 1.3 V is originally written into the memory cell with low threshold voltage VT (LVT-cell), when the voltage further increases by ΔPL, it is increased to 2.0 V. When the word line is directly deactivated in this state, a high voltage is kept being applied to the memory cell transistor at the time of standby, and thus, the reliability of the device is degraded.

In the present invention, therefore, only the memory cell MC with low threshold voltage VT is selectively discharged, and writing voltages for the storage nodes SN at the time of deactivation of the word line are made uniform according to the following method. By doing so, the reliability of the device is enhanced. More specifically, the voltage of the common source line of PMOS CSP is decreased to voltage VSP by the CS line driver CSD mentioned in FIG. 5, for example, at the timing after the plate line PL is driven next to the input of the precharge command PRC. By doing so, the bit line voltage on the "H" side is decreased to VDP (for example, 0.7 V).

As a result, in the memory cell transistor in the memory cell MC with low threshold voltage VT, since an effective gate voltage VGS-VT becomes 0.9 V (=(1.8−0.7)−0.2) and thus the transistor is ON strongly, the charges in the storage node SN are discharged quickly. On the other hand, since VGS-VT becomes 0.4 V in the memory cell with intermediate threshold voltage VT and the transistor is ON weakly, the discharge is gentle. Since VGS-VT obtains a negative value in the memory cell with high threshold voltage VT, the transistor is retained in a cut-off state.

As shown in FIG. 6, therefore, the voltage which is increased too high by the discharge of the excessively written charges is reduced in the memory cell with low threshold voltage VT (LVT-cell), and the voltages are approximately maintained in the memory cell with intermediate threshold voltage (MVT-cell) and the memory cell with high threshold voltage (HVT-cell). For this reason, variation in the writing voltage becomes smaller than that in the threshold voltage VT. After such a discharge operation is ended, the word line WL0 is allowed to fall, and the BLEQ signal and the SHR signal are again activated and the bit line pair BLT/B is precharged.

When the above-described configuration and operation according to the present invention are used, the amount of charges to be written into the memory cells are increased by driving the plate, and retention characteristics and an operation speed are improved. Simultaneously, even when the variation in the threshold voltage is wide, the variation in the amount of the writing charges can be reduced by means of the adjusting method which discharges excessive writing charges. As a result, since it is possible to prevent a high voltage from being applied to the memory cell transistor for a long time, the reliability of the device can be improved. Also, since the word line voltage can be reduced, the thickness of the gate oxide of the memory cell transistor can be reduced, and the micro-fabrication is achieved. As a result, the manufacturing cost can be reduced owing to the increase in capacity of the DRAM chip and reduction in chip size.

Figure 7:
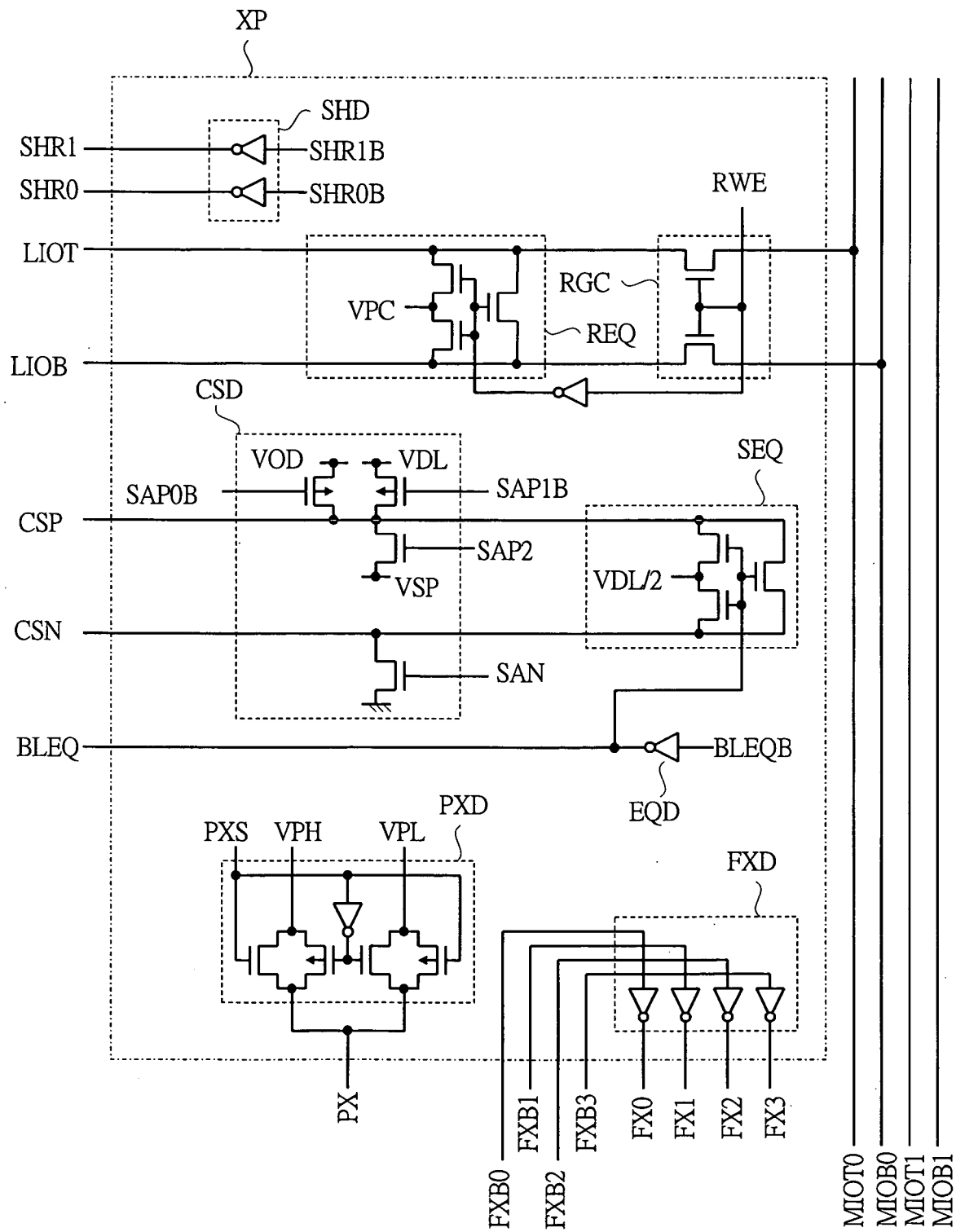
FIG. 7 is a circuit diagram illustrating a modified example of the configuration of the cross area in FIG. 5.

Incidentally, the description above shows the example where the level of the common source line of PMOS CSP when the sense amplifier SA is activated is set to two kinds of voltages VDL and VSP in the CS line driver CSD. In addition, as shown in FIG. 7, it is also possible to combine an overdrive sense scheme therewith. FIG. 7 is a circuit diagram illustrating one example where its configuration in the cross area in FIG. 5 is modified.

The cross area XP in FIG. 7 is shown as a circuit configuration example where the plate driven scheme and the overdrive sense scheme are used in combination with each other, and the configuration of the CS line driver CSD is different when compared with the circuit shown in FIG. 5. More specifically, a PMOS transistor, which temporarily drives the common source line of PMOS CSP to overdrive voltage VOD when an initial sense amplifier enable signal of PMOS SAP0B is activated, is added to the CS line driver CSD shown in FIG. 7. The voltage VOD is higher than the final "H" level voltage VDL of the bit line, and is for increasing the speed of an amplifying operation of the sense amplifier SA. Note that, even when types of drivers are increased in such a manner, since the CS line driver CSD is arranged in the cross area XP, the area of the sense amplifiers is not increased, and the micro-fabrication can be advantageously achieved.

Figure 8:
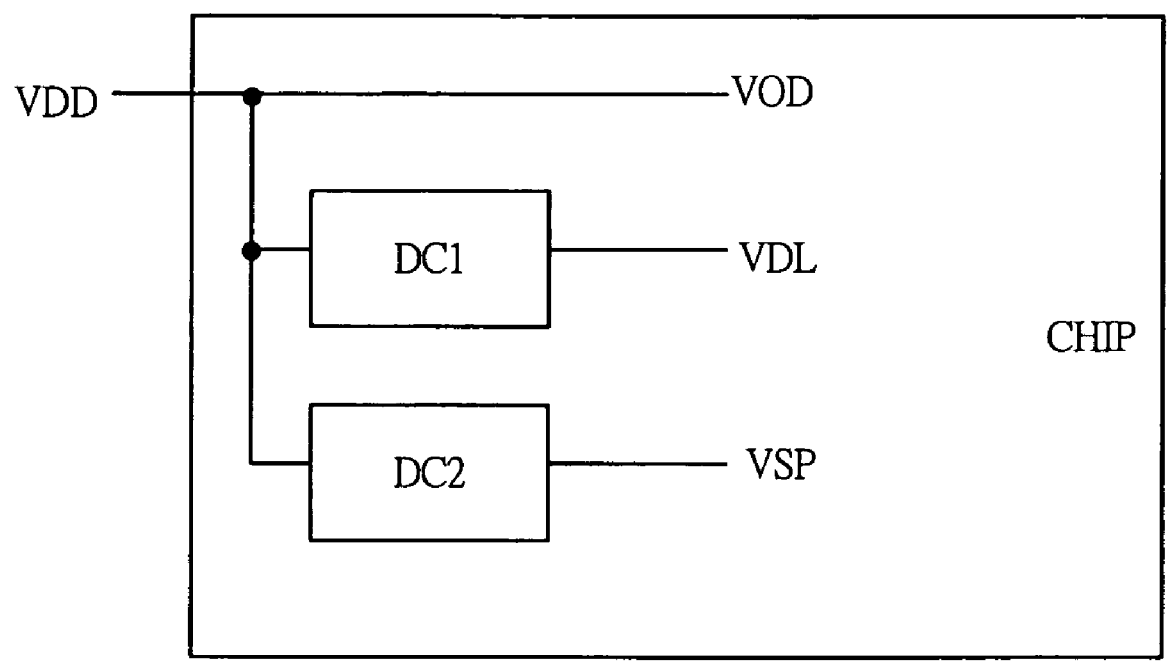
FIG. 8 is a schematic diagram illustrating one example of a scheme of generating a voltage to be used in a CS line driver in the cross area of FIG. 7.

FIG. 8 is a schematic diagram illustrating one example of a generating scheme of a voltage to be used in the CS driver in the cross area of FIG. 7. Since the overdrive voltage VOD is higher than the final "H" level voltage VDL of the bit line, as shown in FIG. 8 for example, the external power supply voltage VDD to be supplied from the outside of the memory chip CHIP can be directly used. The "H" level voltage VDL of the bit line is generated by reducing the external power supply voltage VDD by a voltage limiter DC1. The voltage VSP is required to have a value lower than the bit line voltage VDP at the time of the discharge mentioned in FIG.

6 by the threshold voltage of the PMOS transistor in the cross-coupled amplifier CC. For this reason, it is desired that the voltage VSP is reduced to be lower than a half of the bit line voltage VDL/2 by using a voltage limiter DC2, or the ground voltage VSS is directly used as the voltage VSP.

Figure 9:
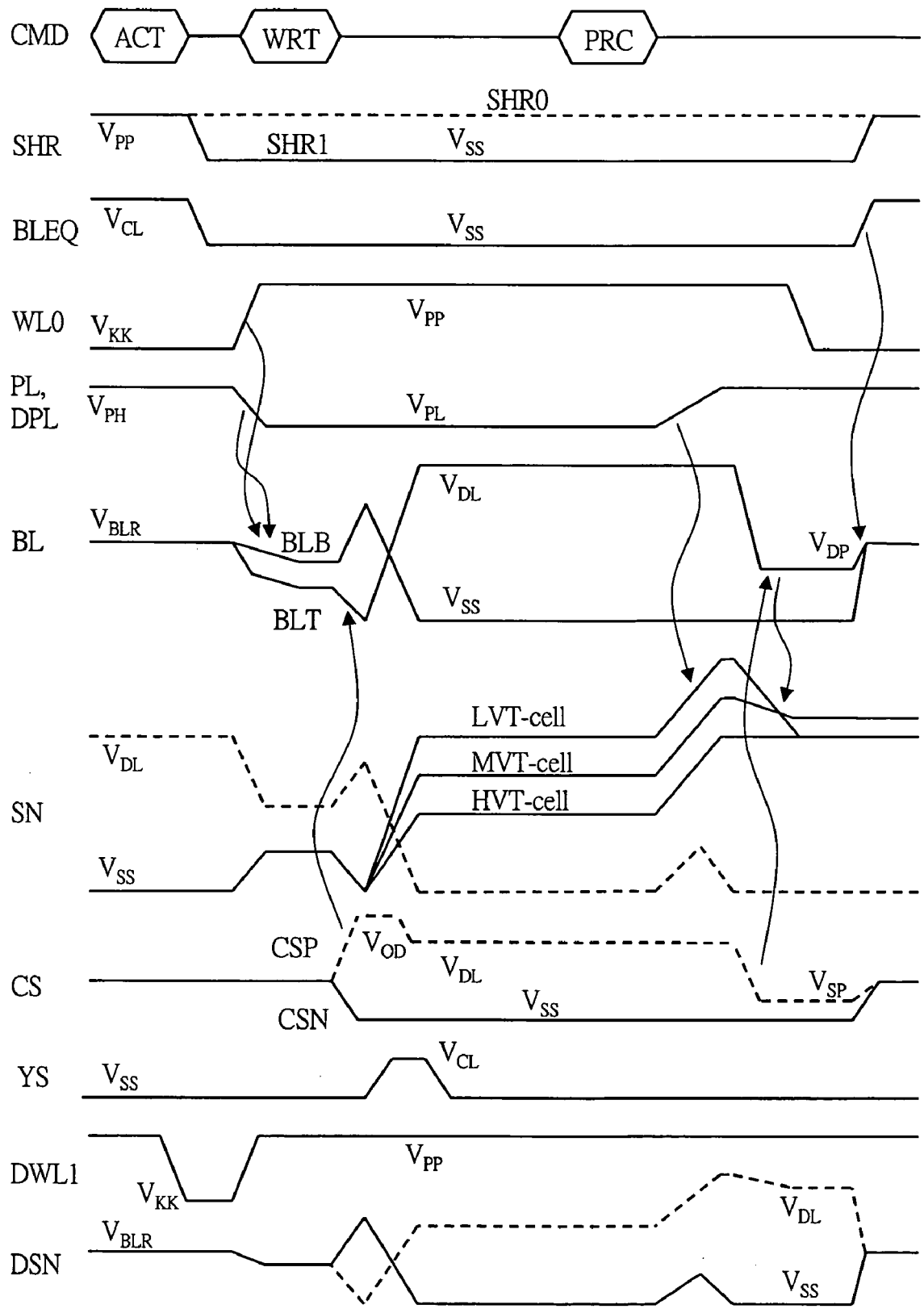
FIG. 9 is a waveform diagram illustrating one example of an operation in the case where the cross area of FIG. 7 is used in the semiconductor memory device in FIG. 1A and FIG. 1B.

When the plate driven scheme and the overdrive sense scheme are combined as described above, the operation is as shown in FIG. 9. FIG. 9 is a waveform diagram illustrating one example of the operation when the cross area in FIG. 7 is used in the semiconductor memory device of FIG. 1A and FIG. 1B. In the operation waveforms shown in FIG. 9, different from the operation waveforms in FIG. 6, the common source line of PMOS CSP is temporarily driven by the overdrive voltage VOD at the initial amplification by means of the sense amplifier SA. After the bit line pair BLT/B is sufficiently amplified, the common source line of PMOS CSP is driven to the voltage VDL. When such driving is carried out, the speed of the amplifying operation of the bit line is increased at the time of the reading operation and the rewriting operation. The subsequent operation is similar to that in FIG. 6.

Figure 10A:
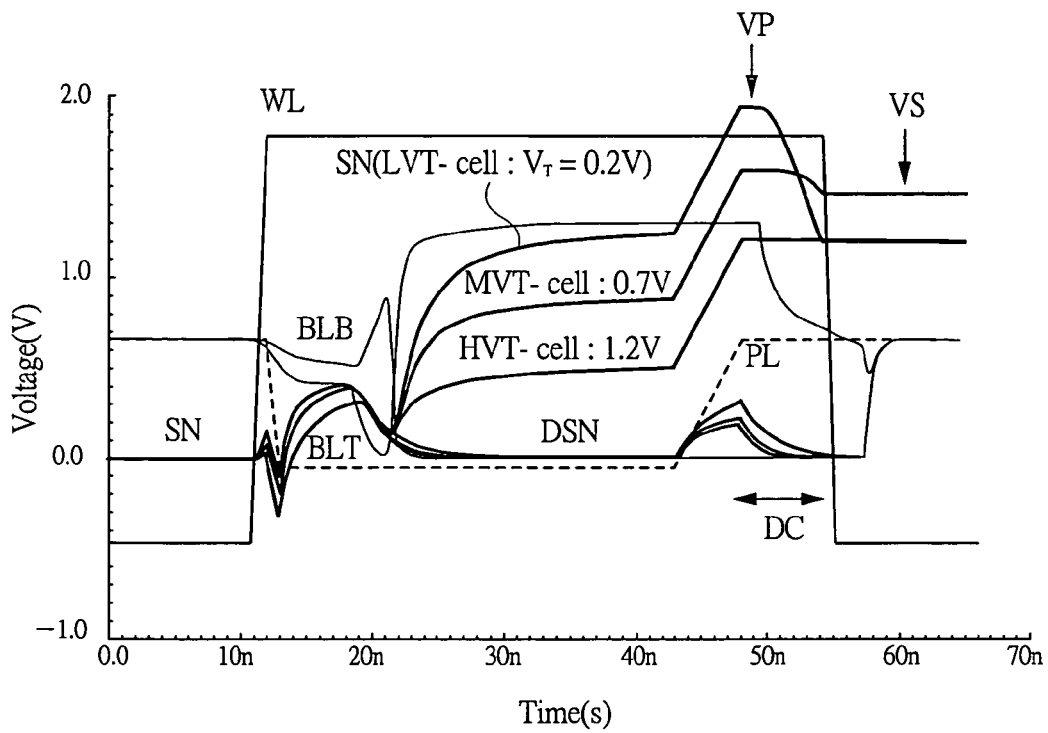
FIG. 10A is a waveform chart of a main part in the operation of FIG. 6 reproduced by circuit simulation.
Figure 10B:
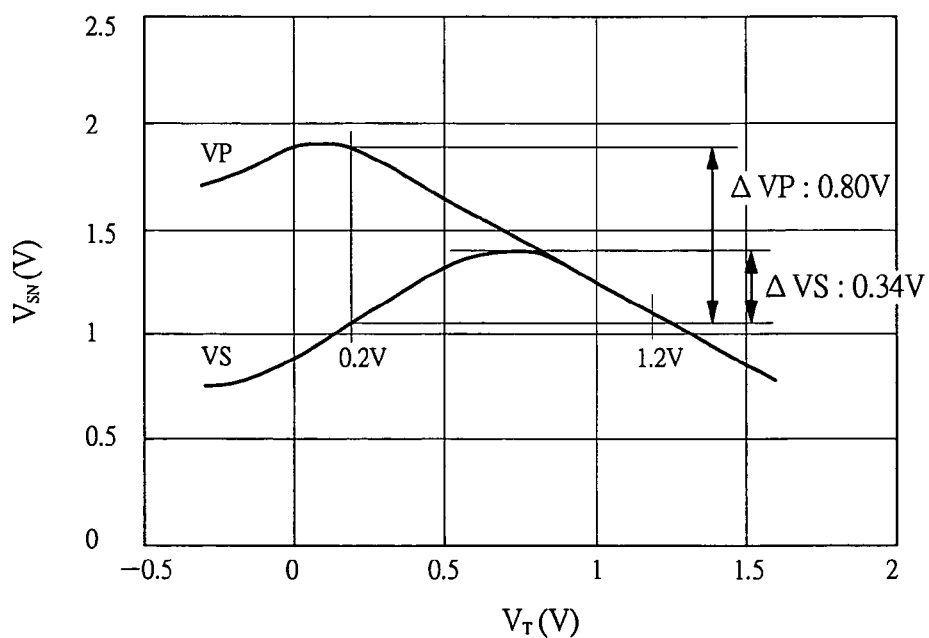
FIG. 10B is a graph illustrating a relationship between a threshold voltage and a writing voltage in the operation.

FIG. 10A and FIG. 10B are diagrams showing the operation of FIG. 6 reproduced by circuit simulation, in which FIG. 10A is a waveform chart of a main part in the operation, and FIG. 10B is a graph illustrating a relationship between a threshold voltage and a writing voltage in the operation. In FIG. 10A, as described with reference to FIG. 6, the word line WL is activated to 1.8 V and the voltage of the plate line PL is reduced by 0.7 V. In this state, a signal is generated on the bit lines BLT and BLB. At this time, when the signal amplification of the bit lines BLT and BLB is started and inverse writing is performed, the variation in writing voltage for the storage node SN occurs in accordance with the difference in the threshold voltage VT.

Thereafter, when the voltage of the plate line PL is increased, the voltage of the storage node SN in the memory cell MC into which "H" is written is increased, but the voltage of the dummy storage node DSN in the dummy memory cell DMC on the "L" side is once increased and then returned to the ground voltage VSS immediately. In the memory cell MC into which "H" is written, the voltage of the bit line BLT is decreased for a period shown by DC, thereby discharging the excessively written charges. As a result, the final writing voltage variation is reduced.

In the graph shown in FIG. 10B, the horizontal axis represents the threshold voltage VT of the memory cell transistor, and a vertical axis represents the voltage VP at the period just after the plate driving and the voltage VS at the period just after the discharge operation is performed for 7 ns and the word line is deactivated in the storage node SN. If the variation range of the threshold voltage VT is 0.2 to 1.2 V, as shown in FIG. 10B, the maximum voltage VP of the storage node SN at the period just after the plate driving is nearly 2.0 V, and the variation $\Delta$VP becomes 0.80 V. More specifically, when the discharge operation is not performed, an excessive voltage of 0.80 V is applied to the memory cell transistor.

On the other hand, when the discharge operation is performed, since the voltage of the storage node SN is finally discharged to the voltage VS, the maximum value is 1.3 V when VT is about 0.7 V and the variation $\Delta$VS becomes 0.34 V. That is, the excessive voltage to be applied to the memory cell transistor is suppressed to 43%. As a result, the reliability of the memory cell transistor is improved, and the micro-fabrication is facilitated.

Figure 11:
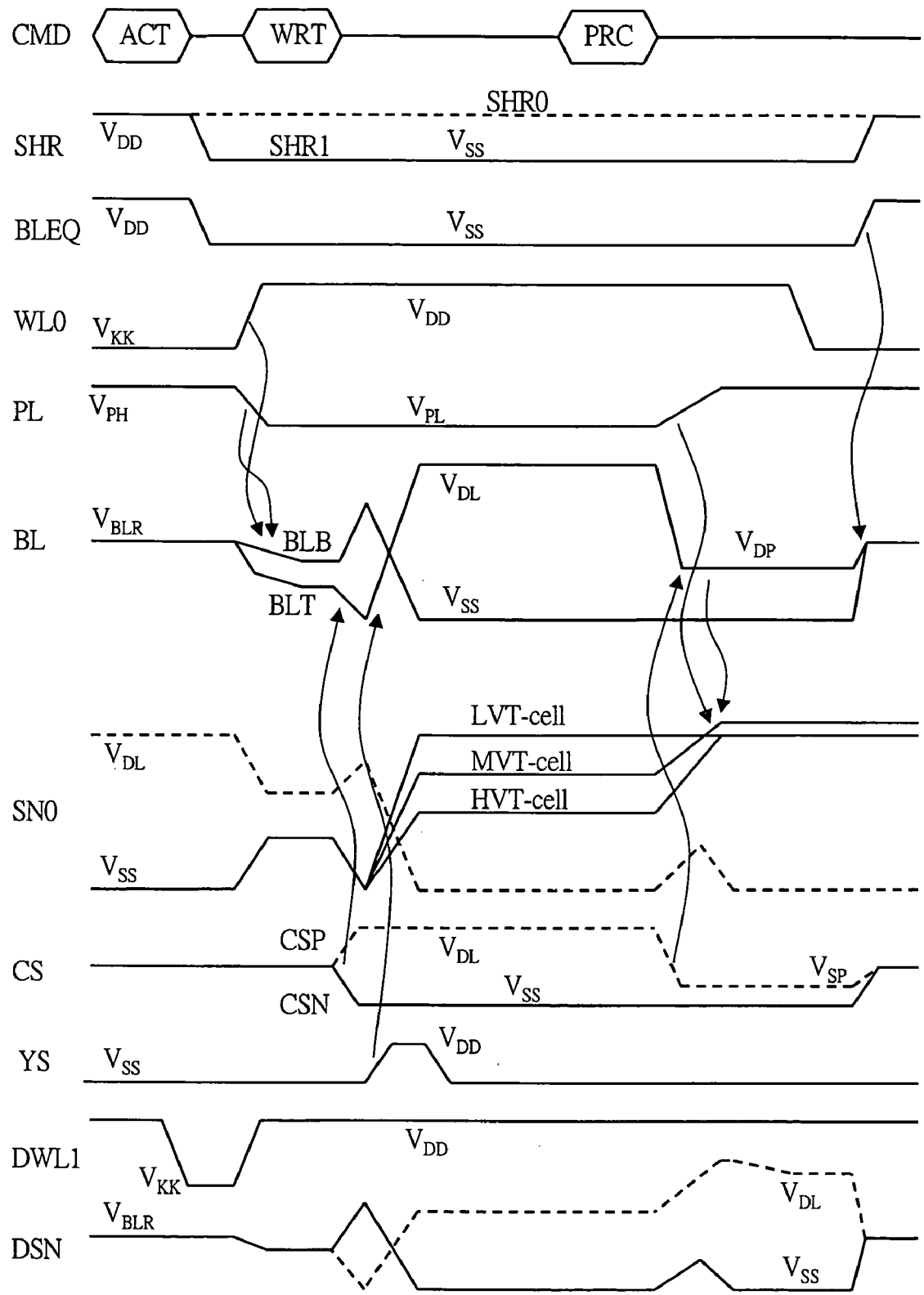
FIG. 11 is an operation waveform diagram illustrating one modified example of the operation in FIG. 6 in the semiconductor memory device in FIG. 1A and FIG. 1B.
Figure 12:
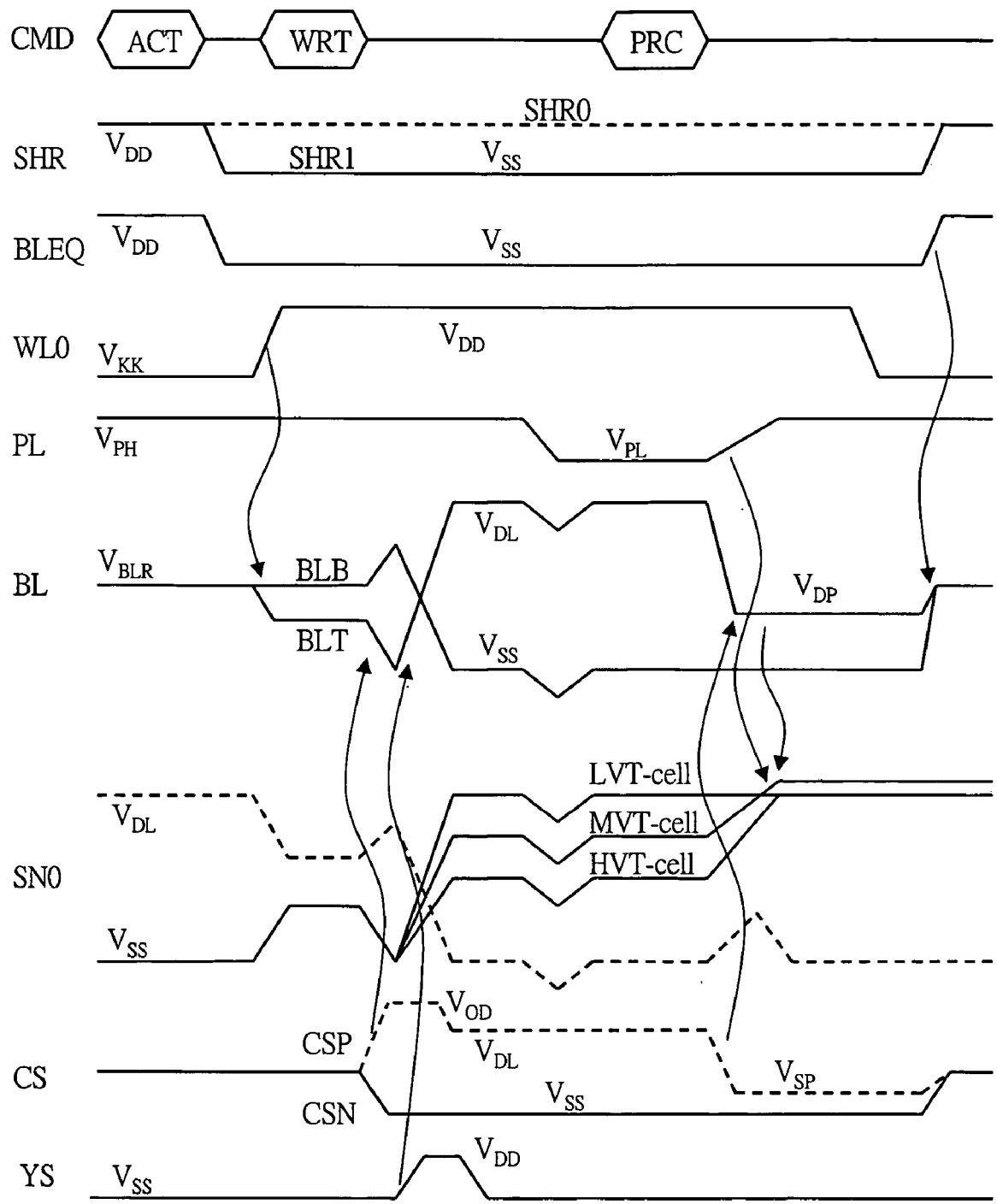
FIG. 12 is an operation waveform diagram illustrating one modified example of the operation in FIG. 6 in the semiconductor memory device in FIG. 1A and FIG. 1B.

FIG. 11 and FIG. 12 are operation waveform diagrams illustrating modified examples of the operation in FIG. 6 in the semiconductor memory device of FIG. 1A and FIG. 1B. The operation shown in FIG. 11 relates to the operation in FIG. 6 and illustrates the case where the operation for increasing the voltage VPL of the plate line PL to the voltage VPH and the driving of the common source line of PMOS CSP to the voltage VSP are performed simultaneously. In FIG. 6, just after the voltage of the plate line PL is increased, the voltage of the storage node SN increases and a high voltage is applied to the memory cell transistor even for a short time.

On the other hand, in the operation shown in FIG. 11, since the voltage of the storage node SN is increased by the driving of the plate line PL simultaneously with the discharge of the excessive charges from the memory cell with low threshold voltage VT, a peak voltage is not generated on the storage node SN. Therefore, the application of the high voltage to the memory cell transistor can be suppressed, and the reliability of the device can be further improved, and the micro-fabrication can be facilitated.

Further, in the operation shown in FIG. 12 relative to the operation of FIG. 11, the timing that the voltage VPH of the plate line PL is decreased to the voltage VPL is delayed to the time after the activation of the sense amplifier. In this case, since the plate line PL has constant voltage at the time of reading a signal onto the bit line pair BLT/B, the generation of the signal after the activation of the word line is slightly delayed, but the bit line precharge voltage VBLR can be directly used as a reference voltage at the time of the amplification by the sense amplifier. As a result, the dummy memory cell DMC becomes unnecessary, and the chip size can be reduced. In the operation shown in FIG. 12, in addition to the change in the timing of the plate line PL, the common source line of PMOS CSP is temporarily driven by the overdrive voltage VOD at the time of the activation of the sense amplifier, and thus the operating speed of the sense amplifier is increased.

Figure 13A:
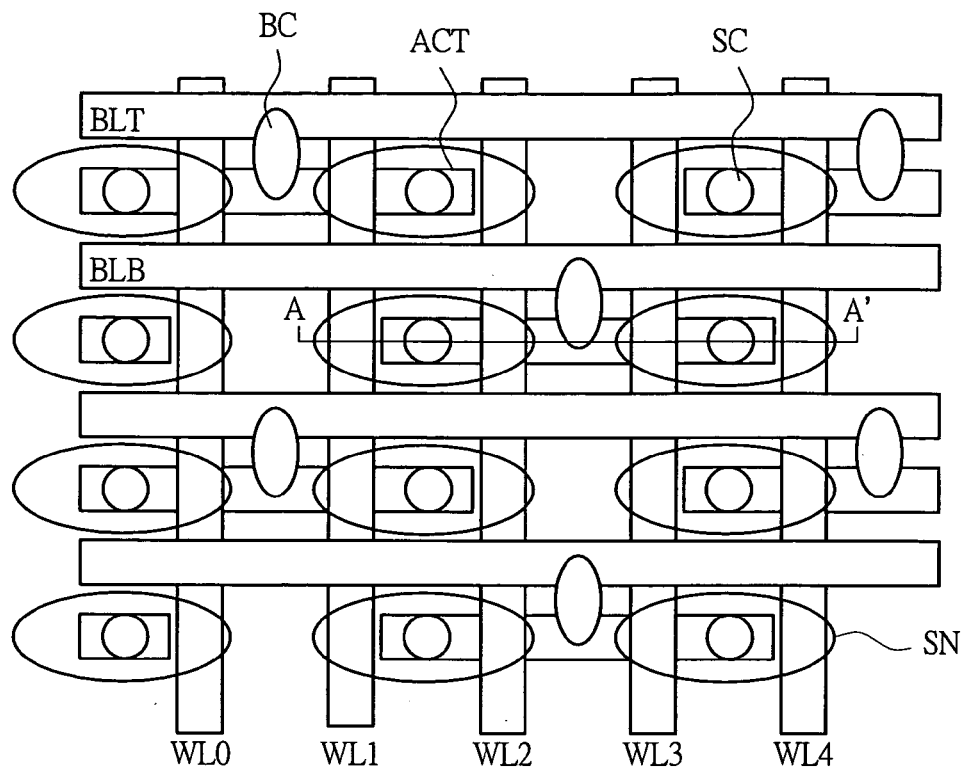
FIG. 13A is a diagram illustrating one example of a layout of the memory array from an activate region to a storage node of a transistor in the semiconductor memory device in FIG. 1A and FIG. 1B.
Figure 13B:
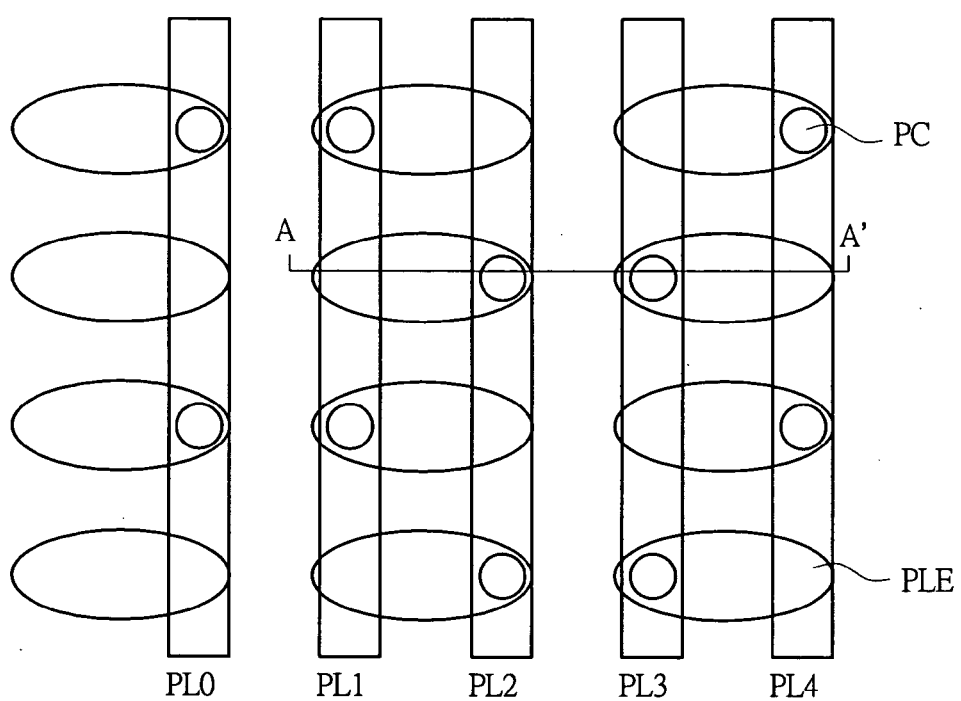
FIG. 13B is a diagram illustrating one example of a layout of the memory array from a plate electrode to a plate line in the semiconductor memory device.
Figure 14:
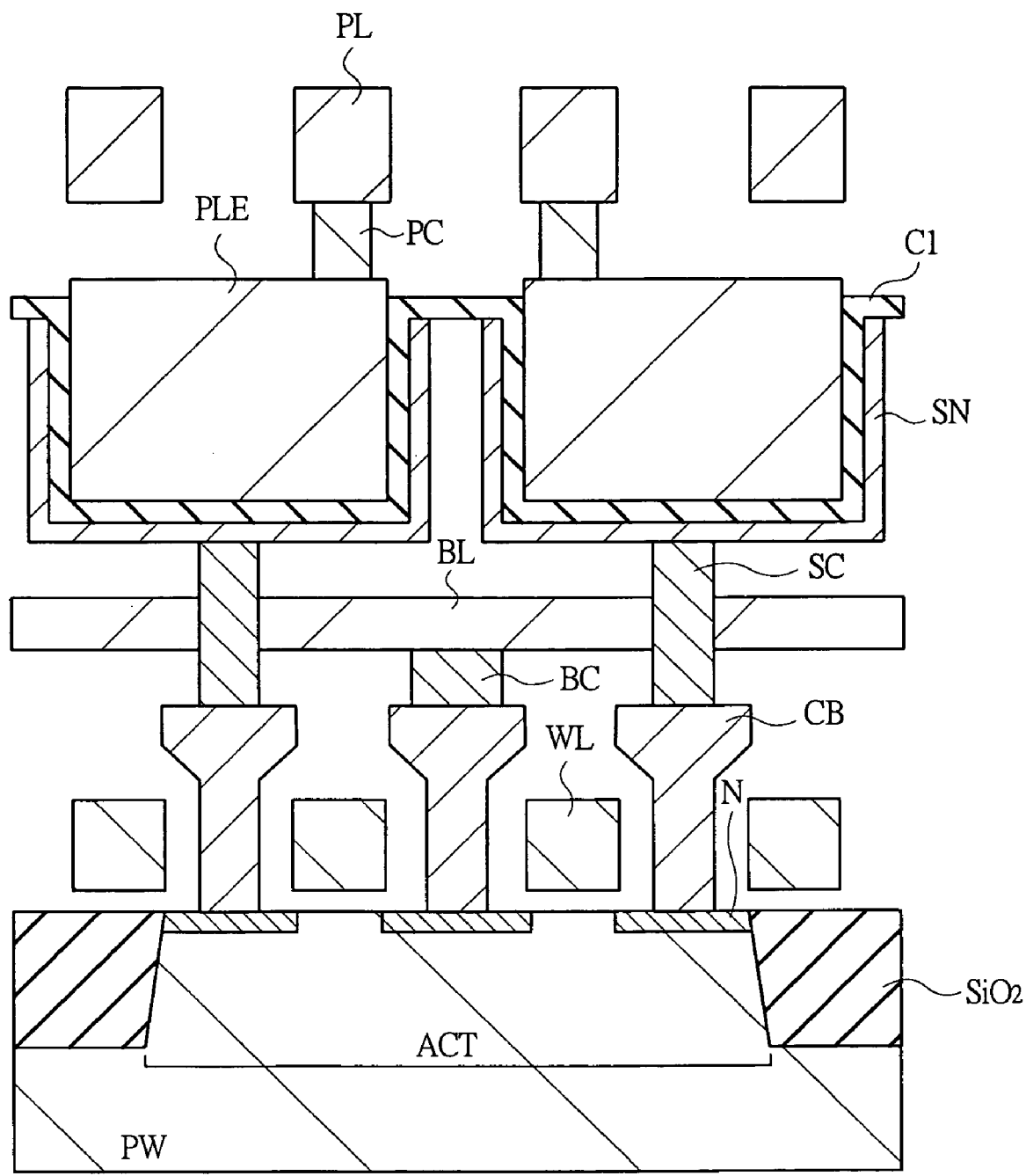
FIG. 14 is a diagram illustrating one example of a sectional configuration taken along the line A–A' in the layout of FIG. 13A and FIG. 13B.

FIG. 13A and FIG. 13B are diagrams showing examples of the layout of the memory array in the semiconductor memory device in FIG. 1, in which FIG. 13A is a diagram illustrating an layout from an active region to a storage node of a transistor, and FIG. 13B is a diagram illustrating an layout from a plate electrode to a plate line. FIG. 14 is a diagram illustrating one example of a sectional configuration taken along the line A–A' in the layouts of FIG. 13A and FIG. 13B. The layouts shown in FIG. 13A and FIG. 13B include a plurality of word lines WL0 to WL4 and a plurality of adjacent bit line pairs BLT/B, and the complementary operation is performed by the bit line pairs BLT/B. Note that, in the layout, the bit line pair BLT/B intersects one word line, and the layout is called as a folded bit-line memory array.

In the layout shown in FIG. 13A, a plurality of active regions ACT are formed in parallel with the bit lines, and the two word lines extend on each active region ACT. In each active region ACT, two memory cell transistors using the two word lines as respective gates are formed. One ends of sources/drains of the two memory cell transistors are connected to the bit lines via common bit line contacts BC, respectively, and the other ends are connected to respectively different storage nodes SN via different storage node contacts SC. A horizontal width of each storage node SN in the bit line direction can be a size which overlaps the two adjacent word lines.

In the layout shown in FIG. 13B, a plurality of plate electrodes PLE are formed so as to correspond to each of the storage nodes SN of FIG. 13A, and a plurality of plate lines PL0 to PL4 are formed so as to correspond to each of the plurality of word lines WL0 to WL4. More specifically, the layout of the plural plate lines PL0 to PL4 and the plural plate electrodes PLE can be approximately the same as the layout of the plural word lines WL0 to WL4 and the plural storage nodes SN in FIG. 13A. In this case, since a horizontal width of each plate electrode PLE in the bit line direction may be a size which overlaps the two adjacent plate lines, each plate electrode PLE can be connected to any one of the two overlapped plate lines via a plate contact PC.

Each DRAM memory cell has, as shown in FIG. 14, an N channel MOS transistor (memory cell transistor) formed on a semiconductor substrate PW and a stack capacitor provided on the bit line BL. In FIG. 14, the two word lines WL are arranged on the active region ACT in the semiconductor substrate PW isolated by a dielectric film $SiO_2$, the two word lines WL are used as the gates of the memory cell transistor, and N type diffusion layer regions N to be the sources/drains of the memory cell transistor are provided on the semiconductor substrate PW.

A contact CB is arranged on the N type diffusion layer region N between the two word lines WL, and a bit line contact BC is arranged on the contact CB. The bit line BL which is formed in a direction perpendicular to the extending direction of the word lines WL is arranged on the bit line contact BC. On the other hand, the contact CB is arranged on each N type diffusion layer region N on the outside of the two word lines WL, and the storage node contact SC is arranged on each contact CB. The storage node SN with a concave shape (cylinder shape) which is formed on an inner wall of a hole in an interlayer dielectric film (not shown) is arranged on each storage node contact SC, and the plate electrode PLE is embedded in each storage node SN, and they form the capacitor Cs with interposing a capacitor dielectric film CI therebetween.

The plate contact PC is arranged on each plate electrode PLE, and it is connected to the plate line PL arranged in the word line direction. FIG. 14 illustrates the stack capacitor in which only insides of the storage node SN electrodes formed in deep holes are used as the capacitor. Since the use of this capacitor can isolate the plate electrodes PLE on the storage nodes SN, an isolation process is advantageously facilitated. Alternatively, the capacitor using not only the insides of the storage node SN electrodes but also the outsides thereof is also available. In this case, however, the capacity can be increased, but since the plate electrodes PLE have to be isolated below the storage node SN electrodes, the isolation process becomes complicated.

In FIG. 13B, the contact is provided on every other storage node SN, and the memory cells selected by the word lines WL0 to WL4 are connected to the corresponding plate lines PL0 to PL4, respectively. Further, the storage nodes SN and the plate electrodes PLE have a horizontally long shape in the folded bit line layout, and they extend over the region of the two word lines WL.

Accordingly, since the plate lines PL are arranged in an approximately linear shape and the contacts are arranged alternately on the adjacent plate lines PL, the plate lines PL can be easily isolated for each word line. Further, since the active regions ACT of the MOS transistor are formed in a linear pattern, the manufacturing process is facilitated. As a result, the micro-fabrication can be easily realized, and since the bit line and the reference bit line from which a signal is generated are present in the same array, a noise can be advantageously reduced.

Figure 15A:
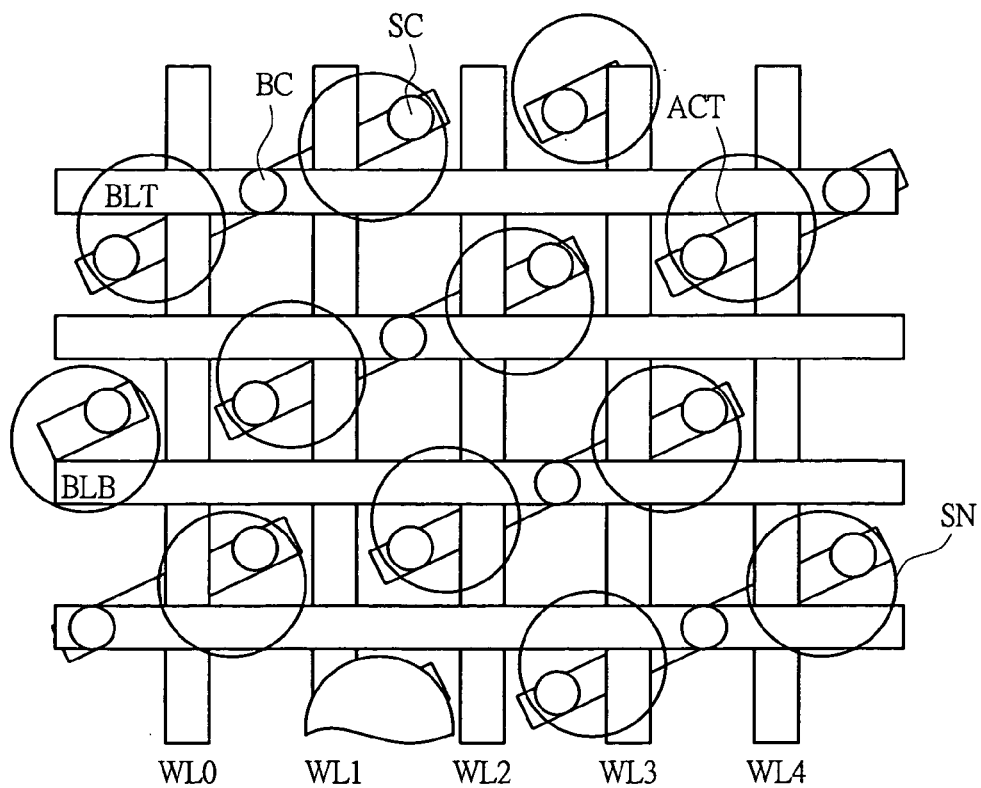
FIG. 15A is a diagram illustrating one example of a layout of a memory array from an active region to a storage node of a transistor different from FIG. 13A in the semiconductor memory device in FIG. 1A and FIG. 1B.
Figure 15B:
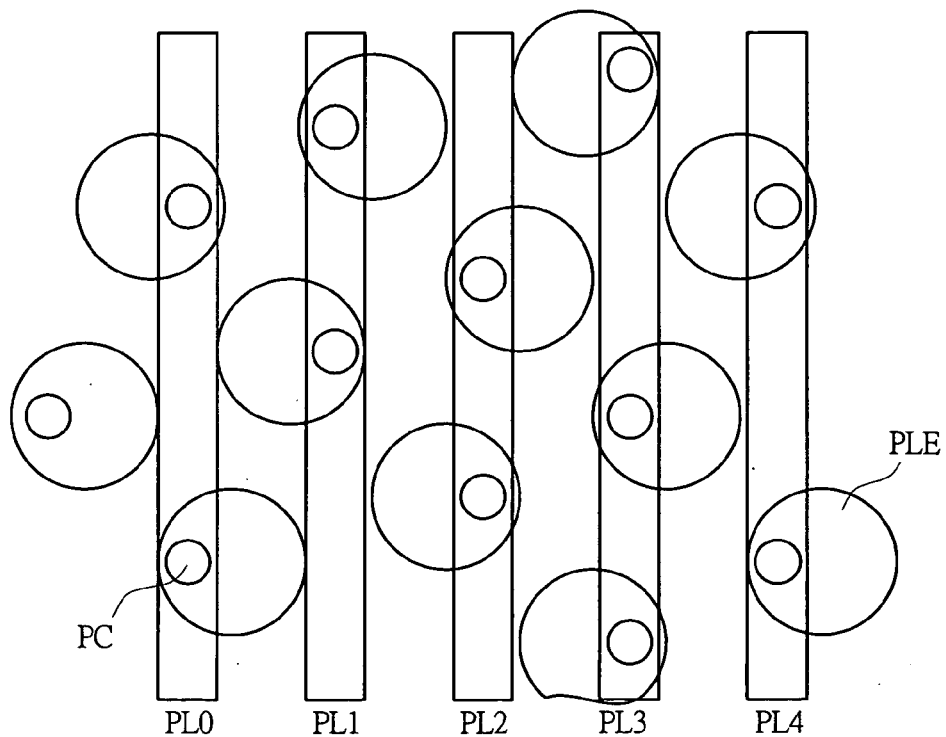
FIG. 15B is a diagram illustrating one example of a layout from a plate electrode to a plate line different from FIG. 13B in the semiconductor memory device.

FIG. 15A and FIG. 15B are diagrams showing examples of the layout of the memory array different from that in FIG. 13A and FIG. 13B in the semiconductor memory device in FIG. 1, in which FIG. 13A is a diagram illustrating a layout of a memory array from the activate region to the storage node of a transistor, and FIG. 15B is a diagram illustrating a layout from the plate electrode to the plate line. The layouts shown in FIG. 15A and FIG. 15B are called as a quasi folded bit-line memory array (quarter pitch memory array), and include the plural word lines WL0 to WL4 and the plural bit lines, in which the complementary operation is performed by the bit line pair BL/BLB which sandwiches one bit line.

In the layouts shown in FIG. 15A and FIG. 15B, the active regions ACT described in FIG. 13 are formed obliquely with respect to the bit lines, and the two storage node contacts SC in each active region ACT are formed so as to sandwich the bit line. When this layout is used, the shape of the storage node SN can be approximately circular, and thus the capacity of the capacitor can be easily secured even when the micro-fabrication is advanced. Also, since the bit line and the reference bit line for generating a signal are present in the same memory array even in the quasi folded bit-line memory array, the noise can be advantageously reduced.

Figure 16A:
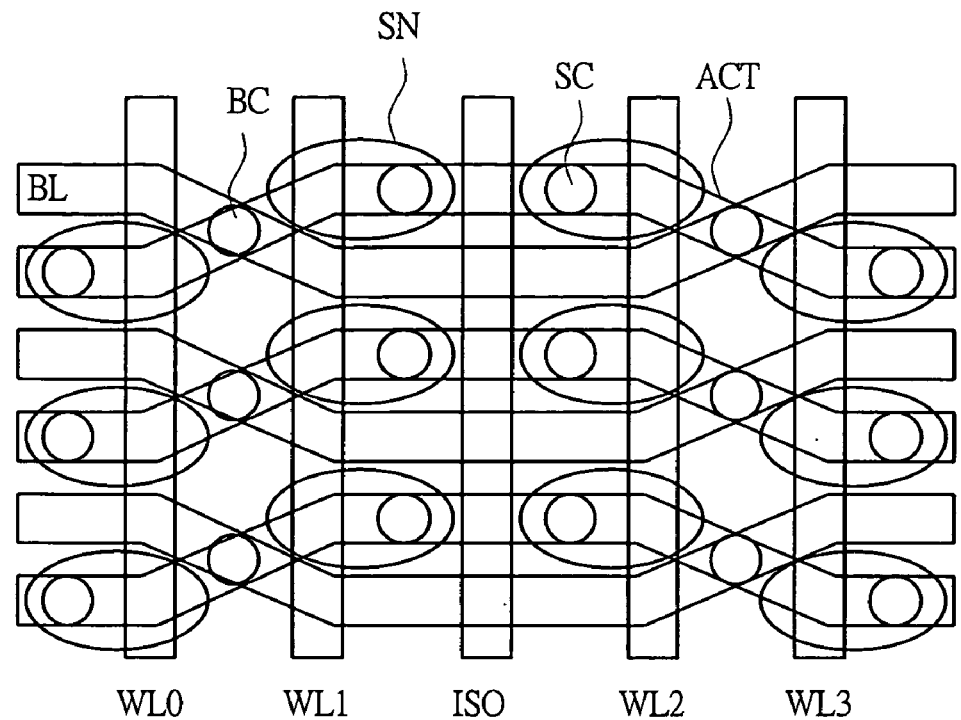
FIG. 16A is a diagram illustrating one example of a layout of a memory array from an active region to a storage node of a transistor different from FIG. 13A in the semiconductor memory device in FIG. 1A and FIG. 1B.
Figure 16B:
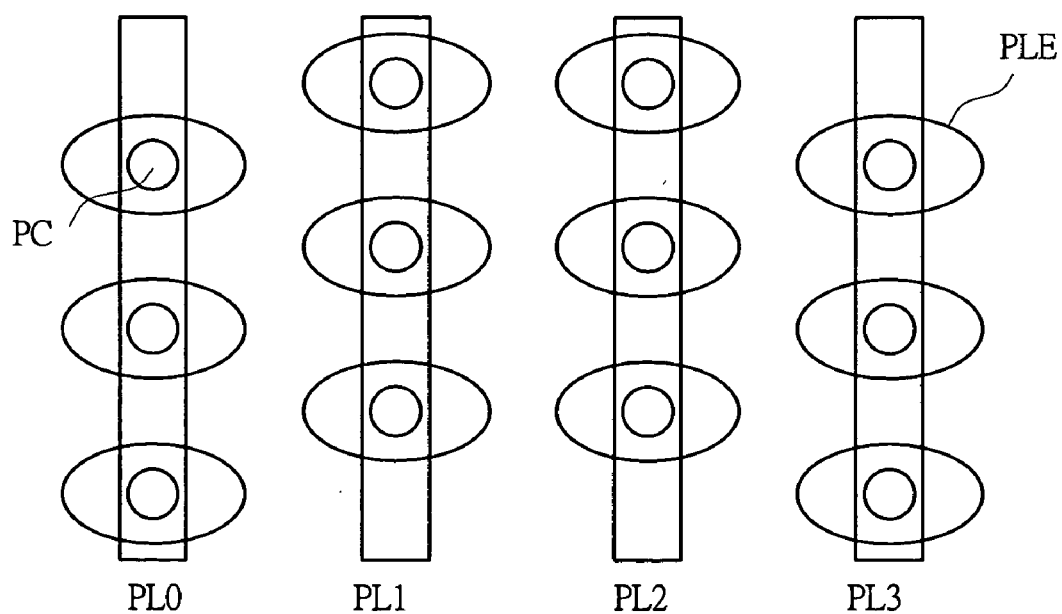
FIG. 16B is a diagram illustrating one example of a layout from a plate electrode to a plate line different from FIG. 13B in the semiconductor memory device.

FIG. 16A and FIG. 16B are diagrams showing examples of the layout of the memory array different from that of FIG. 13A and FIG. 13B in the semiconductor memory device in FIG. 1, in which FIG. 16A is a diagram illustrating a layout from the active region to the storage node of a transistor, and FIG. 16B is a diagram illustrating a layout from the plate electrode to the plate line. The layouts shown in FIG. 16A and FIG. 16B are called as an open bit-line memory array where only one of the bit line pair BLT/B intersects one word line. In addition, the layouts are a narrow bit-line pitch type open bit-line memory array where the pitches of the bit lines BL are narrowed.

In this memory array, the DRAM memory cells are provided to all intersections between the bit lines BL and the word lines WL. The paired bit lines BLT and BLB are present in the memory arrays on the opposite sides via the sense amplifiers. In FIG. 16A and FIG. 16B, the plural active regions ACT are formed continuously in the direction of the bit lines BL, and the plural word lines WL extend on each active region ACT. However, one of the three word lines WL is used as an element isolating gate ISO, and it is driven to "L" level or is connected to a fixed voltage of "L" level according to need.

When the word lines WL are arranged at the pitch of 2F (F: minimum processing dimension), the pitch of the bit lines BL can be set to 2F or less. Since the effective pitch of the word lines WL becomes 3F due to the presence of the element isolating gate ISO, the size of the memory cell becomes $6F^2$. Therefore, the size of the memory cell can be reduced to be smaller than $8F^2$, which is the size of the memory cell in the folded bit-line memory array, and thus, this is useful for the micro-fabrication. Further, when this memory array is used, since the storage nodes SN in the memory cell selected by one word line WL are arranged linearly, the plate line PL can have a linear pattern. Further, since the pitch of the plate lines PL can be widened to 3F, the manufacturing process can be advantageously facilitated.

Figure 17A:
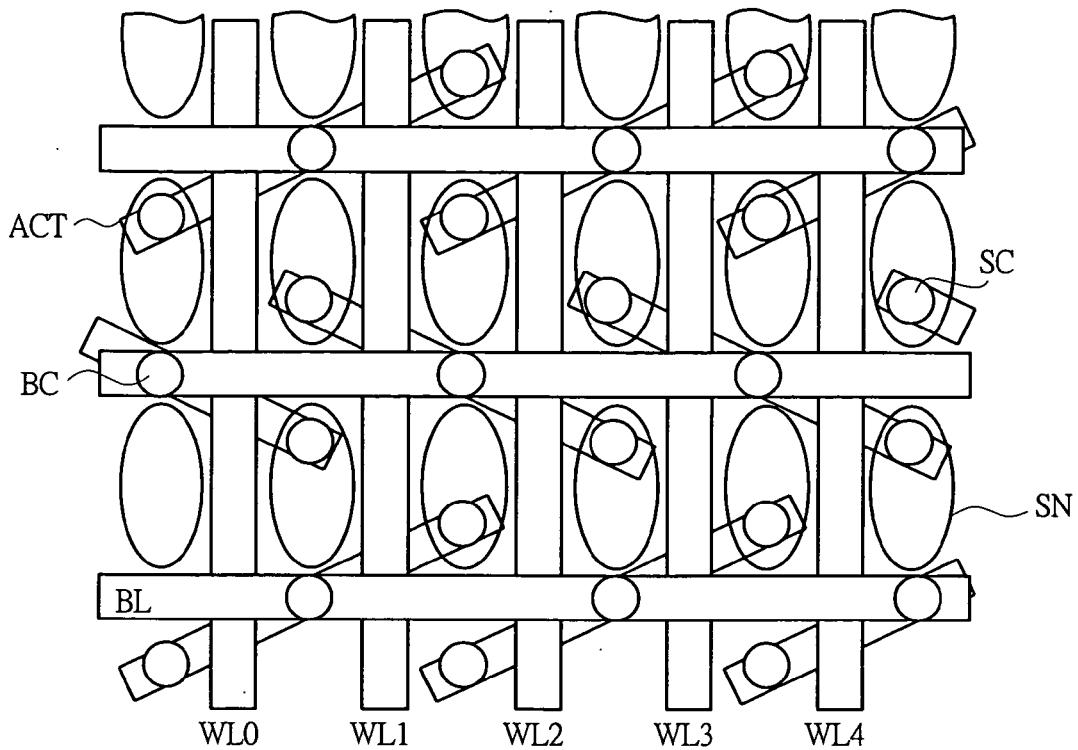
FIG. 17A is a diagram illustrating one example of a layout of a memory array from an active region to a storage node of a transistor different from FIG. 16A in the semiconductor memory device in FIG. 1A and FIG. 1B.
Figure 17B:
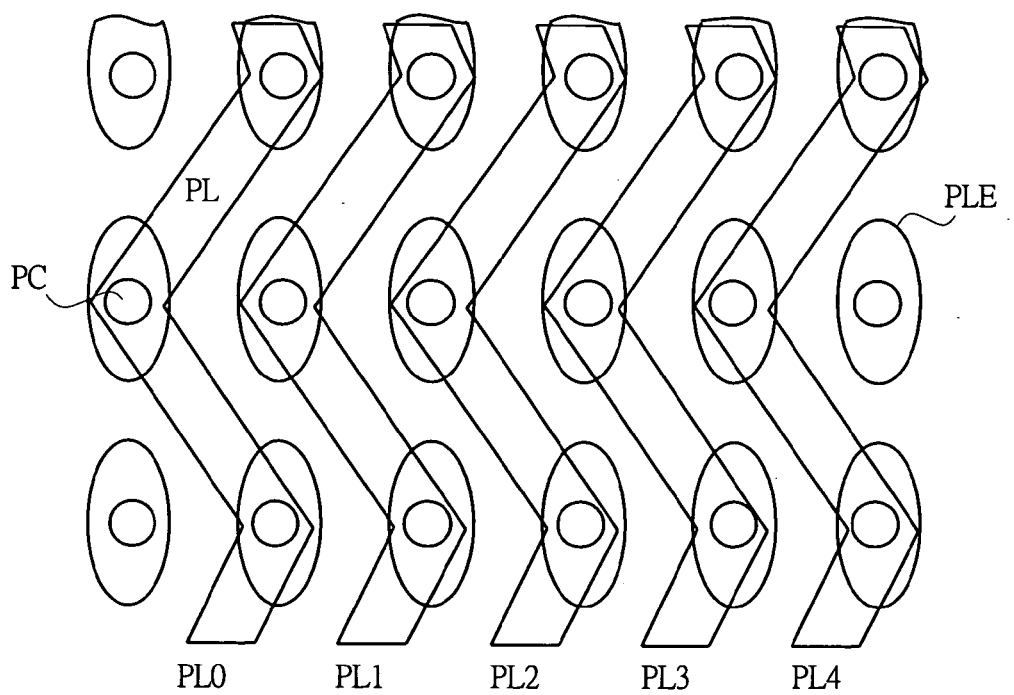
FIG. 17B is a diagram illustrating one example of a layout from a plate electrode to a plate line different from FIG. 16B in the semiconductor memory device.

FIG. 17A and FIG. 17B are diagrams showing the examples of the layout of the memory array different from that in FIG. 16A and FIG. 16B in the semiconductor memory device in FIG. 1A and FIG. 1B, in which FIG. 17A is a diagram illustrating a layout from the activate region to the storage node of the transistor, and FIG. 17B is a diagram illustrating a layout from the plate electrode to the plate line.

The layouts shown in FIG. 17A and FIG. 17B are the layout of a wide bit-line pitch type open bit-line memory array.

In this memory array, the DRAM memory cells are provided to all the intersections between the bit lines BL and the word lines WL. The paired bit lines BLT and BLB are present in the memory arrays on the opposite sides via the sense amplifier. In FIG. 16A and FIG. 16B, the plural active regions ACT are formed obliquely with respect to the bit lines BL, and the two word lines WL extend on each active region ACT.

When the word lines WL are arranged at the pitch of 2F, the pitch of the bit lines BL becomes, for example, 3F. When this memory array is used, an array noise is higher than that of the folded bit-line memory array, but the size of the memory cell is $6F^2$. More specifically, it can be reduced to be smaller than $8F^2$ of the folded bit-line memory array. Further, since the pitch of the bit lines BL is wider than the pitch of the word lines WL, a coupling noise between bit lines can be reduced also by the micro-fabrication, and the layout of the sense amplifiers can be advantageously facilitated.

Figure 18:
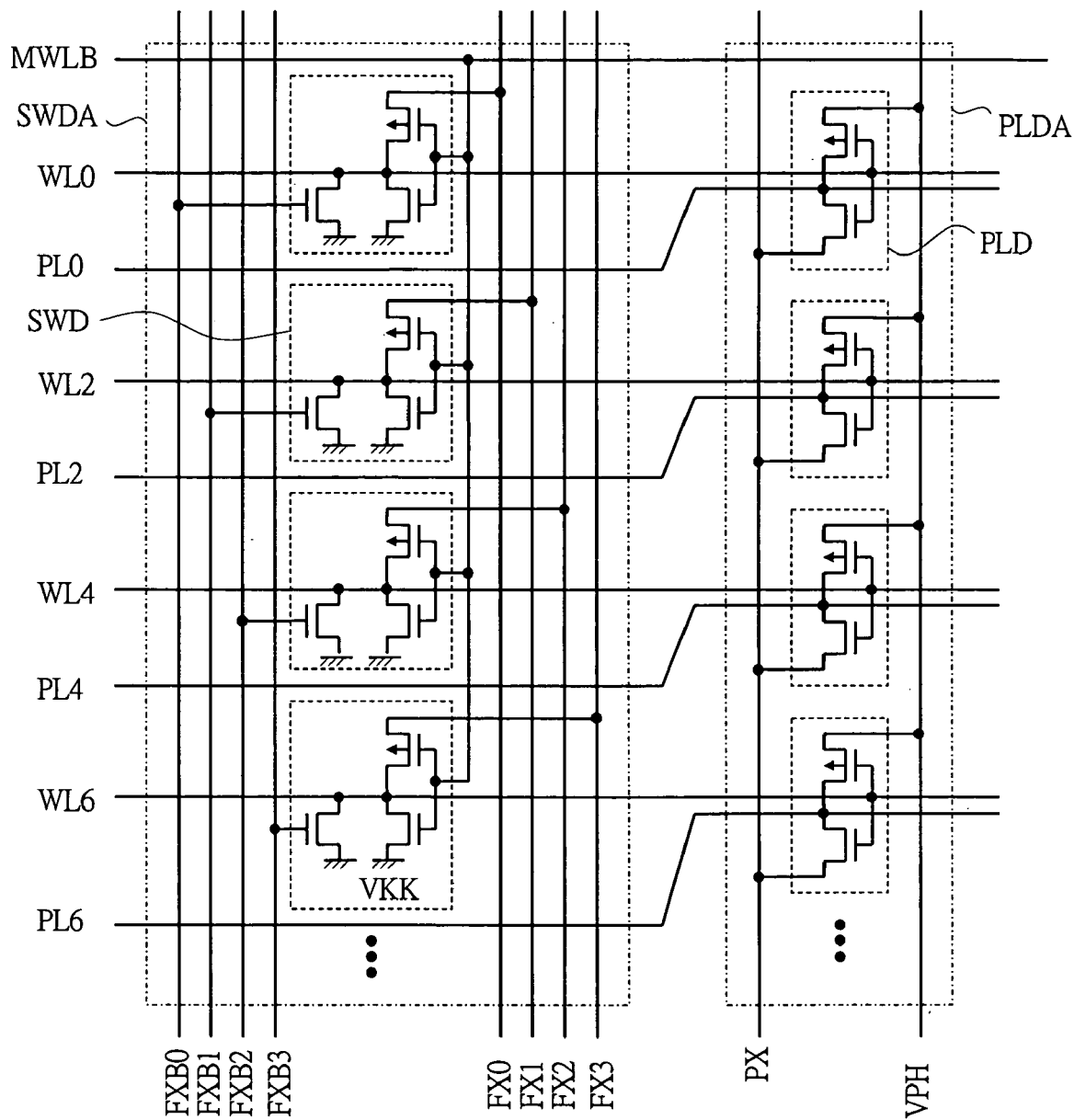
FIG. 18 is a circuit diagram illustrating one example of a configuration of a sub-word driver row and a plate driver row in the semiconductor memory device in FIG. 1A and FIG. 1B.

FIG. 18 is a circuit diagram illustrating one example of a configuration of the sub-word driver row and the plate driver row in the semiconductor memory device in FIG. 1A and FIG. 1B. The sub-word driver row SWDA is composed of a plurality of sub-word drivers SWD, and the plate driver row PLDA is composed of a plurality of plate drivers PLD. Further, as shown in FIG. 1B or the like, the plate driver row PLDA and the sub-word driver row SWDA are arranged adjacent to each other around the memory array ARY.

The sub-word drivers SWD and the plate drivers PLD drive the word lines WL and the plate lines PL in the memory arrays ARY which are arranged on both sides of the drivers SWD and PLD, respectively. At this time, one word line WL is driven so as to correspond to one plate line PL. As shown in FIG. 3, since the plate driver row PLDA and the sub-word driver row SWDA are arranged alternately with respect to the memory array ARY, every other word lines WL (sub-word lines) and every other plate lines PL in the memory array ARY are connected to the sub-word drivers SWD and the plate drivers PLD on the left and right, respectively.

The sub-word driver SWD is composed of two N channel MOS transistors and one P channel MOS transistor. In one N channel MOS transistor, the main word line MWLB is connected to the gate, the word line WL is connected to the drain, and the voltage VKK is connected to the source. In another N channel MOS transistor, the complementary word driver selection line FXB is connected to the gate, the word line WL is connected to the drain, and the voltage VKK is connected to the source.

In the P channel MOS transistor, the main word line MWLB is connected to the gate, the word line WL is connected to the drain, and the sub-word driver selection line FX is connected to the drain. As shown in FIG. 18, four sub-word driver selection lines FX0 to FX4 are arranged on one sub-word driver row SWDA, and one of the four sub-word drivers SWD selected by one main word line MWLB is selected, thereby activating one word line WL.

The plate driver PLD is composed of one N channel MOS transistor and one P channel MOS transistor. In the N channel MOS transistor, the word line WL is connected to the gate, the plate line PL is connected to the drain, and the plate control line PX is connected to the source. In the P channel MOS transistor, the word line WL is connected to the gate, the plate line PL is connected to the drain, and the power supply line of the plate voltage VPH is connected to the source.

Figure 19:
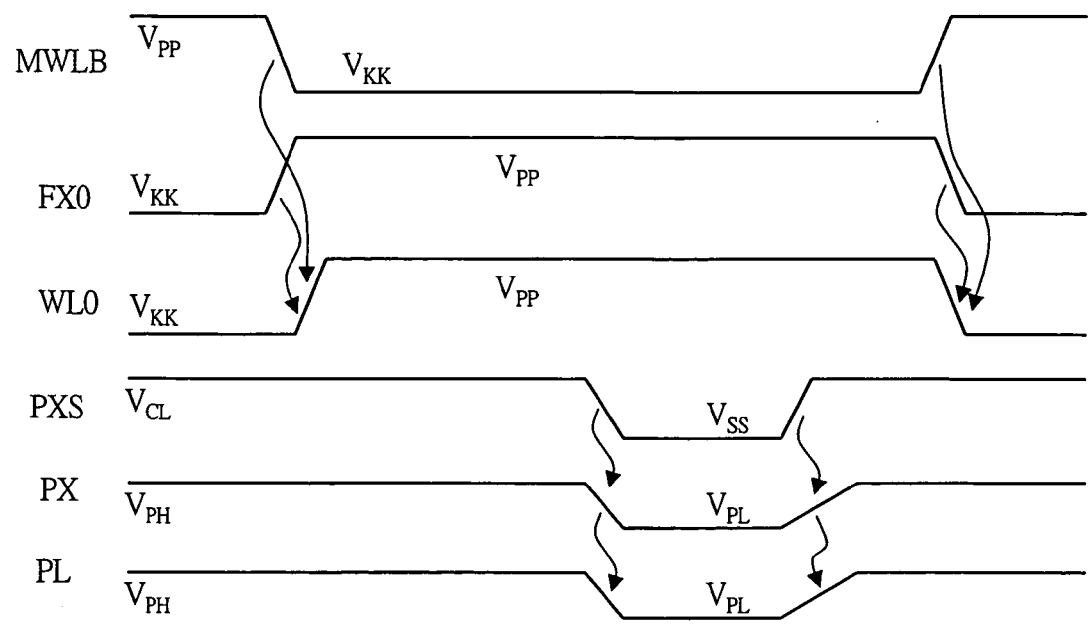
FIG. 19 is a waveform diagram illustrating one example of an operation waveform in the sub-word driver row and the plate driver word in FIG. 18.
Figure 20:
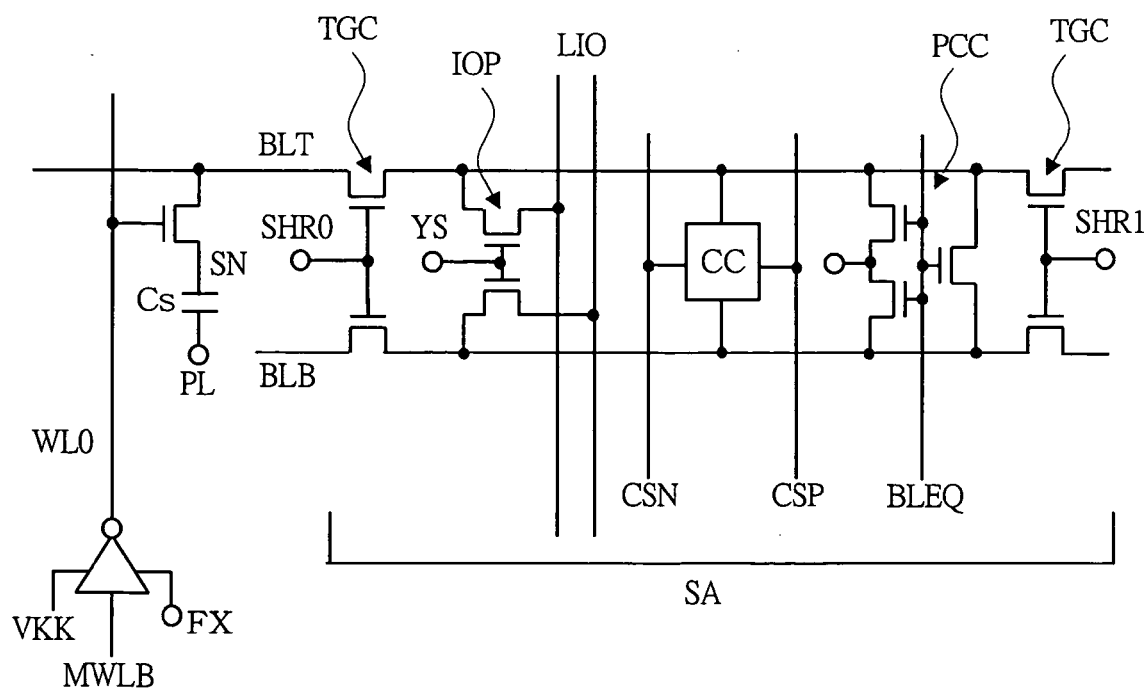
FIG. 20 is a circuit diagram illustrating a configuration example of a part of a DRAM memory array in which the plate is driven in a semiconductor memory device, which is examined as a premise of the present invention.
Figure 21:
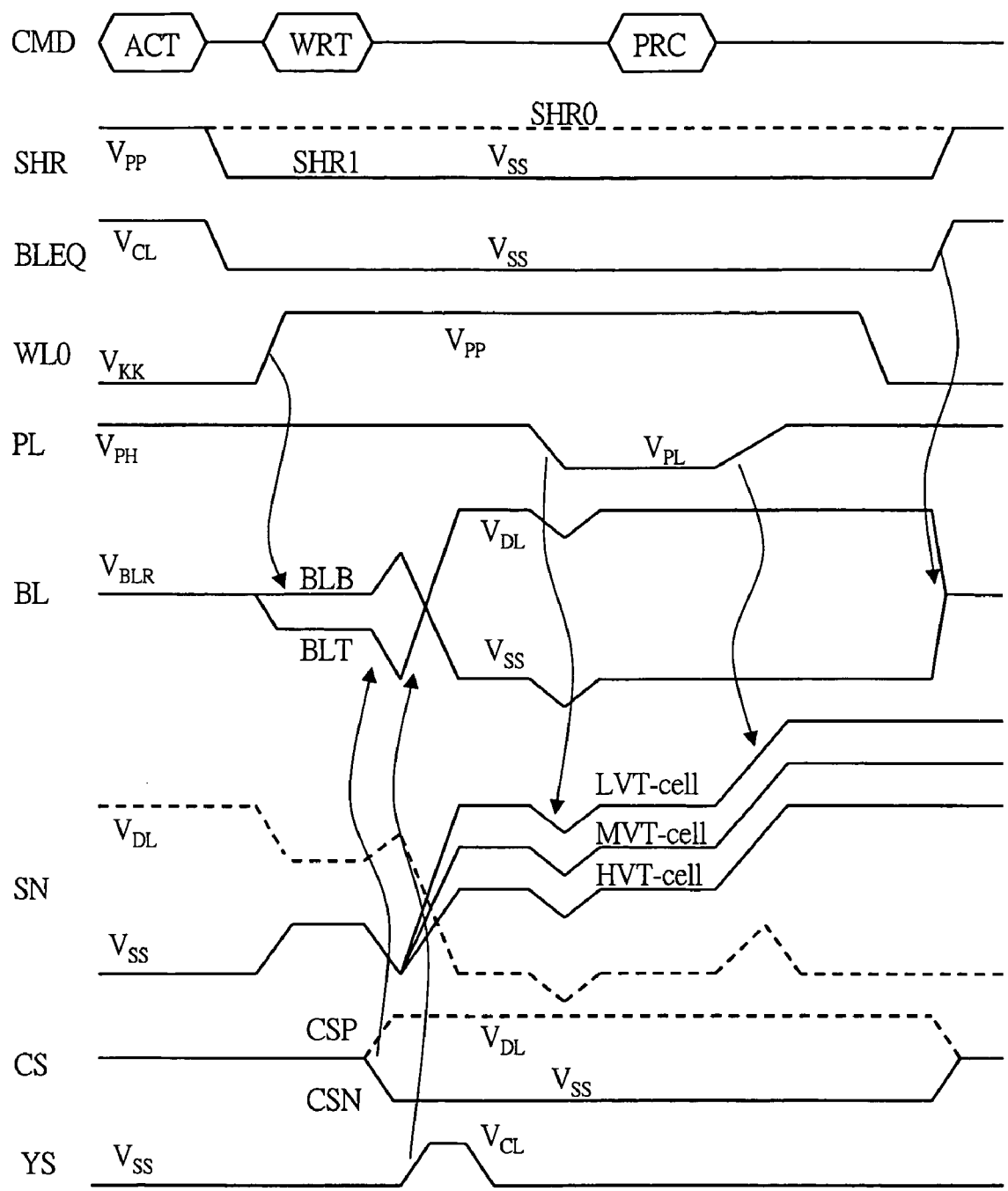
FIG. 21 is an operation waveform diagram illustrating one example of the operation in the semiconductor memory device in FIG. 20.

FIG. 19 is a waveform diagram illustrating one example of the operation waveform in the sub-word driver row and the plate driver row of FIG. 18. When the voltage of the main word line MWLB is decreased to voltage VKK in the row decoder XDEC and the FX line is activated in the array control circuit ACC, the selected word line WL0 is activated to voltage VPP.

When the word line WL0 is in a deactivated state, namely, in a voltage VKK level, the plate line PL is fixed to the voltage VPH. When the word line WL0 is activated to the voltage VPP, the plate line PL and the plate control line PX (PX line) are connected. When a plate timing signal PXS is "H", the PX line driver in the cross area XP of FIG. 5 outputs the voltage VPH to the PX line, and when the plate timing signal PXS is "L", it outputs the voltage VPL to the PX line. By decreasing and increasing the voltage of the PX line in this manner, the voltage of the plate line PL is also decreased and increased similarly.

Figure 22:
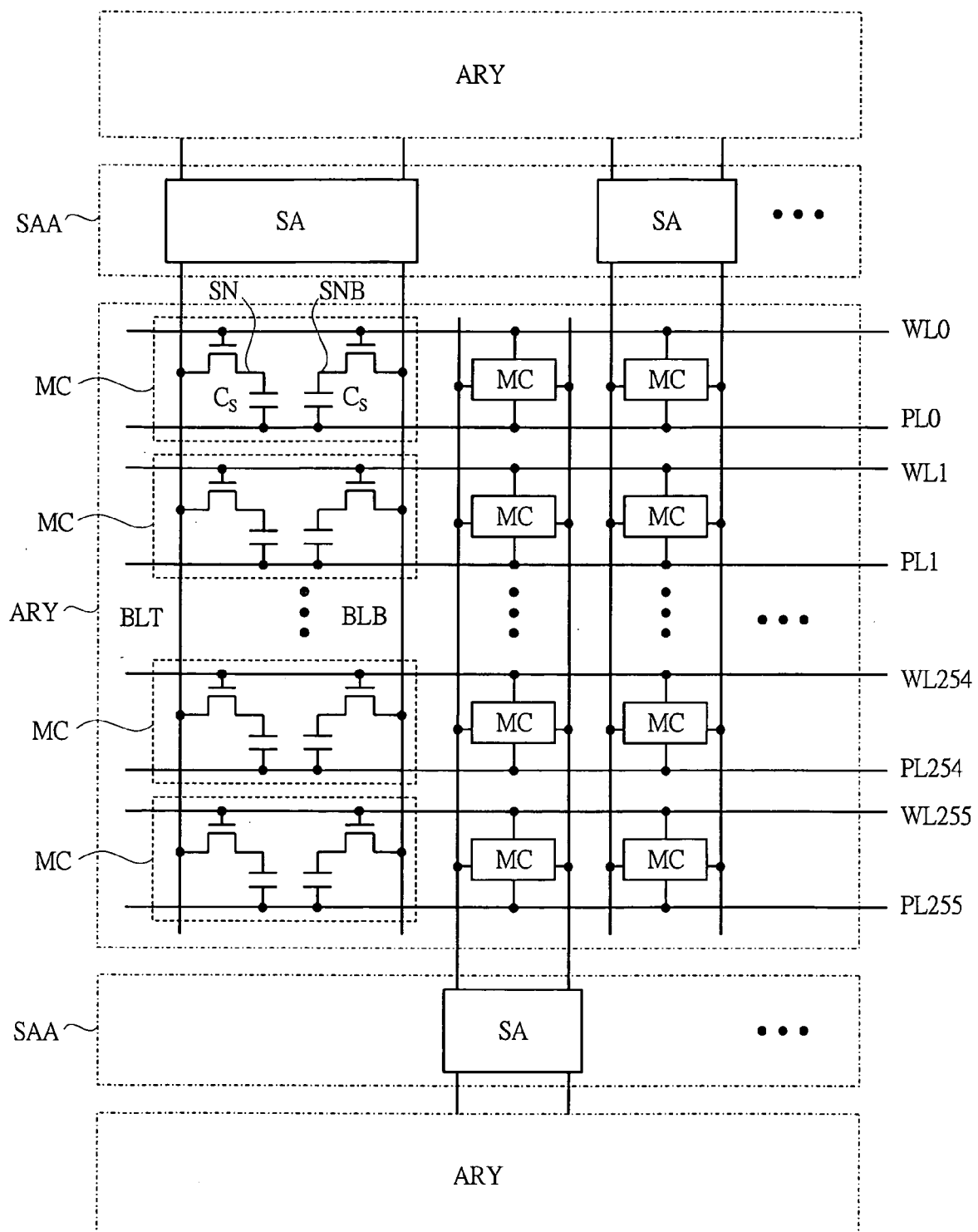
FIG. 22 is a circuit diagram illustrating one example of a modified configuration of the memory arrays and the sense amplifier rows of FIG. 2 in the semiconductor memory device in FIG. 1A and FIG. 1B.

FIG. 22 illustrates the memory array and the sense amplifier rows on its both sides in the case where the present invention is applied to a twin cell array. The memory array is composed of a plurality of memory cells MC. A twin DRAM cell is composed of two MOS transistors and two capacitors, and two DRAM cells compose the memory cell. One of the source and drain of the first MOS transistor is connected to the bit line BLT, the other thereof is connected to the storage node SN, and the gate thereof is connected to the word line WL. One terminal of the first capacitor is connected to the storage node SN, and the other terminal of the capacitor is connected to the plate line PL which is arranged in parallel with the word line. One of the source and drain of the second MOS transistor is connected to the complementary bit line BLB, the other thereof is connected to the storage node SNB, and the gate thereof is connected to the word line WL. One terminal of the second capacitor is connected to the storage node SNB, and the other terminal of the capacitor is connected to the plate line PL which is arranged in parallel with the word line.

Different from a normal DRAM, when the plate line is divided for each one word line and the divided plate lines are arranged in parallel with the word lines so that only the plate line of the memory cell where the word line is activated is driven, disturbance to the other memory cells in a non-selected state is reduced, and simultaneously accumulated voltages can be increased. When the plate is driven in this array, the same level of coupling voltage is applied to the bit line BLT and the complementary bit line BLB, and thus, a dummy cell does not have to be provided unlike FIG. 2. Further, since a signal is generated in both of the bit lines and the complementary bit lines, the amount of a signal to be inputted into the sense amplifier increases, and thus the high-speed operation is achieved. Alternatively, even when the power supply voltage of the sense amplifier is reduced, the large signal amount can be obtained. Therefore, data retention time can be lengthened and the power consumption can be reduced.

Figure 23:
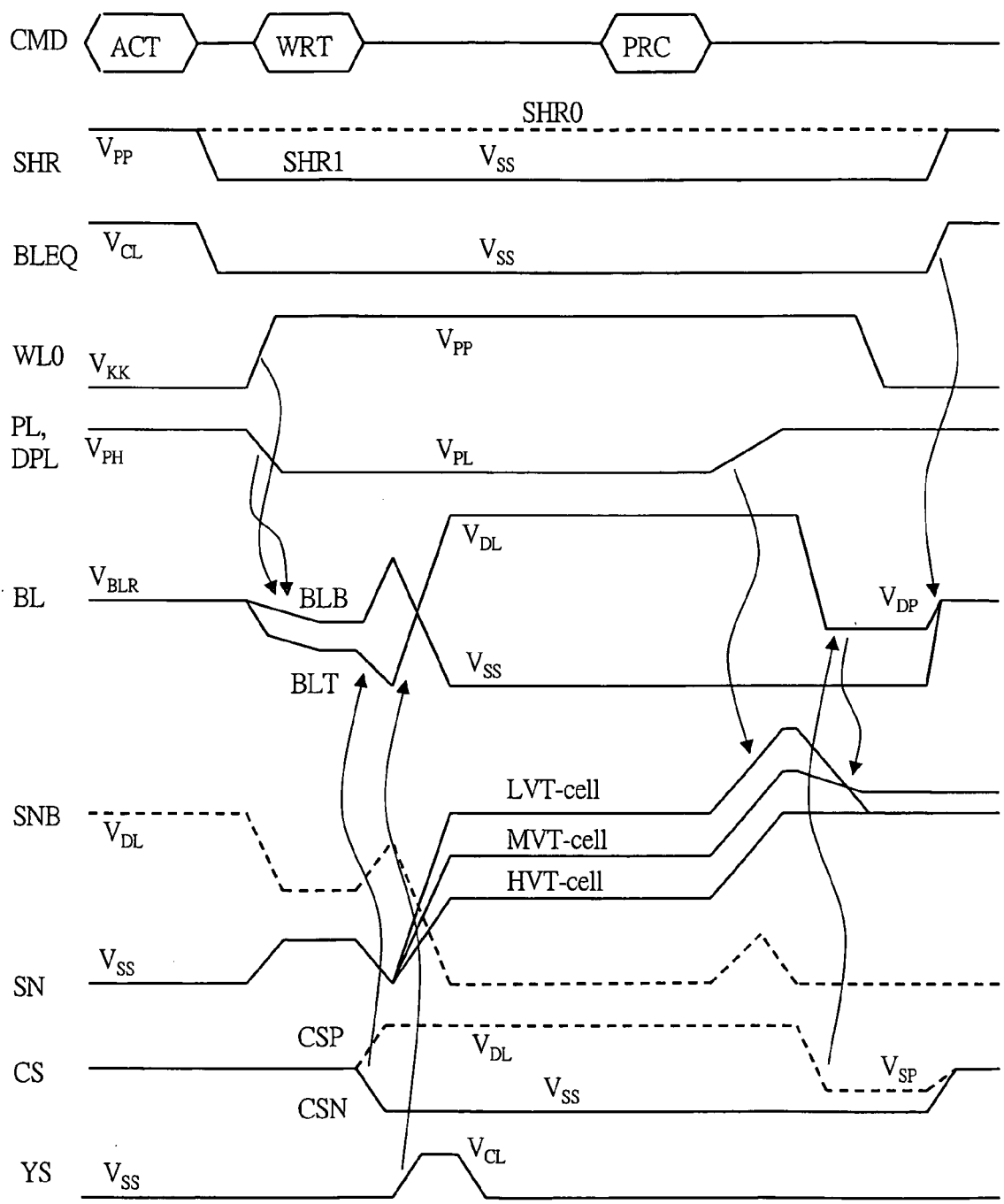
FIG. 23 is an operation waveform diagram illustrating one modified example of the operation of FIG. 6 in the semiconductor memory device in FIG. 1A and FIG. 1B.

FIG. 23 illustrates a driving method of the twin cell array shown in FIG. 22. This example shows the case where the plate driving scheme of FIG. 6 is applied to the twin cell array. The difference from FIG. 6 is that a dummy cell is not necessary and a complementary signal is generated in the bit lines BLT and the complementary bit lines BLB.

The operation waveform of FIG. 23 shows the operation of the DRAM array according to one embodiment of the present invention. When the bank activation command ACT is inputted from the outside of the chip, one of the sense amplifier isolating signals SHR and the precharge signal BLEQ are deactivated in the sense amplifier row SAA specified by an address. When the voltage of the main word line MWLB is reduced to VKK in the row decoder and FX is activated in the array control circuit ACC, the selected word line WL0 is activated to VPP. In the memory cell selected by the word line WL0, the cell transistor becomes conductive, and a signal is read onto the bit lines BLT and the complementary bit lines BLB. FIG. 23 illustrates an example where the voltage VSS is written into the storage node SN and the voltage VDL is written into the storage node SNB and a signal "0" is generated. Further, the plate line PL of the selected cell is allowed to fall from VPH to VPL. When the plate line is driven in this manner, since the levels of SN and SNB in the selected cells are reduced by the coupling via a cell capacity, charges are read into the bit lines at high speed. In this case, when VPH is set to an approximately middle value between VDL and VSS, since the voltage to be applied to the capacitor dielectric film in the memory cells is reduced at the time of standby, the reliability can be improved.

When the common source line of PMOS CSP is driven to VDL and the common source line of NMOS CSN is driven to VSS in the sense amplifiers, the signals on the bit lines are amplified. In this state, the chip can receive the read command RD or the write command WRT. The drawing shows the case where the write command is inputted. The column selection line YS of the selected address is activated, and the write data is written from the LIO line pair. In this case, the waveform at the time of inverse writing in which BLT is driven to "H" is shown.

Since the memory cell is the N channel MOS, when the threshold value is set to VT, the maximum voltage which can be written to SN is VPP−VT. In order to reduce the thickness of the gate oxide of the memory cell transistor in the DRAM according to one embodiment of the present invention, VPP which is the H level of the word lines is reduced to about the power supply voltage VDD (for example, 1.8 V). Further, since a lot of miniaturized transistors are used as the memory cell transistors, the variation in the threshold value is very large and is about 1V, and when the design center value is set to, for example, 0.7 V, the minimum value becomes 0.2 V and the maximum value becomes 1.2 V. When the bit line voltage VDL is set to 1.3 V, for example, since VPP−VT=1.6 V in the cell with small threshold value (LVT-cell), the cell transistors are ON and VDL of 1.3 V is written into the storage node SN. In the cell with intermediate threshold value (MVT-cell) and in the cell with high threshold value (HVT-cell), however, the memory cell transistors are cut off during the amplification, and only voltages of up to 1.1 V and 0.6 V are written into the respective storage nodes. More specifically, the SN voltage at the time of writing varies in a range of 0.6 V to 1.3 V in accordance with VT of the cell transistors.

When the precharge command PRC is inputted in this state and the plate PL of the selected cell is returned from VPL to VPH, the potential of SN increases by ΔPL (=VPH−VPL) due to the coupling from the capacitor. Since the cell transistors are cut off in the cell on the SN side into which "H" is written, the increase ΔPL in the potential is retained, but since the cell transistors are ON in the cell on the SNB side into which "L" is written, the voltage is returned to VSS immediately. Therefore, the accumulated amount of charges can be increased by ΔPL. When ΔPL is set, for example, to 0.7 V so that the writing voltage of the memory cell with the highest threshold value (HVT-cell) is increased to VDL, 1.3 V or higher is written into all the memory cells. For this reason, the reading signal amount and the margin for the retention time in the next cycle can be increased. In the cell with low threshold value (LVT-cell), however, since VDL of 1.3 V is originally written, when the potential further increases by ΔPL, the voltage is increased to 2.0 V. When the word lines are deactivated in this state, a high voltage is being applied to the memory cell transistors at the time of standby, and the reliability of the device is degraded.

For its prevention, only the cells with low VT are selectively discharged and the SN writing voltages at the time of deactivating the word lines are made uniform according to the following method. By doing so, the reliability of the device is improved. More specifically, after the plate is driven, the voltage of the common source line of PMOS CSP is decreased to VSP so that the bit line voltage on the "H" side is decreased to VDP (for example, 0.7 V). As a result, in the memory cell with low threshold value (LVT-cell), the effective gate voltage VGS-VT becomes 0.9 V (=(1.8−0.7)−0.2), and the transistor is ON strongly. Therefore, the charges of SN are discharged quickly. On the other hand, since VGS-VT becomes 0.4 V in the memory cell with intermediate threshold voltage VT and the transistor is ON weakly, the discharge is gentle. Also, VGS-VT is negative and the cut-off state is maintained in the cell with high threshold value. Therefore, as shown in the drawing, the potential which increases excessively is reduced in the cell with low threshold value, and the potential in the cells with intermediate and high threshold values is maintained. As a result, the variation in the writing voltage is reduced more than the variation in the threshold value. After the discharging operation is ended, the word line is made to fall and BLEQ and SHR are activated again, and the bit lines are precharged.

As described above, by using the configurations and the operations shown in FIG. 22 and FIG. 23, it is possible to prevent a high voltage from being applied to the cell transistors for a long time. Therefore, the thickness of the gate oxide of the memory cell transistors can be reduced, and the micro-fabrication can be facilitated.

In the foregoing, the invention made by the inventors of the present invention has been concretely described based on the embodiments. However, it is needless to say that the present invention is not limited to the foregoing embodiments and various modifications and alterations can be made within the scope of the present invention.

The semiconductor memory device according to the present invention is particularly effective when applied to DRAM products adopting the plate driven scheme, and it can be also applied to on-chip memories or the like included in logic chips such microprocessors and DSP (Digital Signal Processor).

What is claimed is:

1. A semiconductor memory device, comprising:
   a plurality of memory cells each having a MOS transistor and a capacitor, in which a gate of said MOS transistor is a selection terminal, one of source and drain of said MOS transistor is an I/O terminal, and the other of the source and drain is connected to a storage node of said capacitor;
   a plurality of word lines respectively connected to said selection terminals of said plurality of memory cells;
   complementary bit lines respectively connected to said I/O terminals of said plurality of memory cells;
   sense amplifiers connected to said complementary bit lines and each amplifying a voltage difference between corresponding one of said complementary bit lines to latch the amplified voltage; and means which, after one of said plurality of word lines is activated and at the time when said sense amplifier is activated, one of said complementary bit lines is amplified to a first voltage, and the other complementary bit line is amplified to a second voltage lower than said first voltage, reduces the voltage of the complementary bit line amplified to said first voltage to a third voltage lower than said first voltage at a first time and then deactivates said one of word lines.

2. The semiconductor memory device according to claim 1, wherein said sense amplifier includes first and second P channel MOS transistors and first and second N channel MOS transistors, a source of said first P channel MOS transistor is connected to a common source terminal of PMOS, a gate thereof is connected to a second bit line of said complementary bit lines, and a drain thereof is connected to a first bit line of said complementary bit lines, a source of said second P channel MOS transistor is connected to said common source terminal of PMOS, a gate thereof is connected to said first bit line, and a drain thereof is connected to said second bit line, a source of said first N channel MOS transistor is connected to a common source terminal of NMOS, a gate thereof is connected to said second bit line, and a drain thereof is connected to said first bit line, a source of said second N channel MOS transistor is connected to said common source terminal of NMOS, a gate thereof is connected to said first bit line, and a drain thereof is connected to said second bit line, and said semiconductor memory device further comprises means which, after one of said plurality of word lines is activated and at the time when said common source line of PMOS is driven to said first voltage and said common source line of NMOS is driven to said second voltage, drives said common source line of PMOS to a fourth voltage lower than said first voltage at a first time and then deactivates said one of word lines.

3. The semiconductor memory device according to claim 2, wherein said fourth voltage is lower than a value obtained by subtracting a threshold voltage of said first or second P channel MOS transistor from said third voltage.

4. The semiconductor memory device according to claim 2, wherein said first time is later than a time at which a precharge command is inputted into said semiconductor memory device.

5. The semiconductor memory device according to claim 2, further comprising:

means which, after said one of word lines is activated, drives said common source line of PMOS to a fifth voltage higher than said first voltage, then drives it to said first voltage, and further drives it to said fourth voltage at said first time.

6. The semiconductor memory device according to claim 2, further comprising:

a plurality of plate lines, wherein said plurality of plate lines are connected to plate terminals to be nodes of said capacitors on an opposite side of said storage nodes in said plurality of memory cells, and only the plate terminals in said plurality of memory cells to be connected to the same word line of said plurality of word lines are connected to the same plate line of said plurality of plate lines.

7. The semiconductor memory device according to claim 6, wherein said capacitor has a cylinder shape in which one electrode of said capacitor is formed on an inner wall of a hole in an interlayer dielectric film.

8. The semiconductor memory device according to claim 6, wherein said complementary bit lines are arranged adjacent to each other so as to intersect the same word line of said plurality of word lines.

9. The semiconductor memory device according to claim 6, wherein said complementary bit lines are arranged so as to intersect the same word line of said plurality of word lines with interposing one bit line therebetween.

10. The semiconductor memory device according to claim 6, wherein said complementary bit lines extend in opposite directions with respect to said sense amplifier serving as a center, a plurality of said sense amplifiers are arranged in an extending direction of said plurality of word lines and thus said plurality of bit lines including said complementary bit lines are arranged adjacent to each other, and a pitch between said plurality of word lines is equal to or wider than a pitch between said plurality of bit lines.

11. The semiconductor memory device according to claim 6, wherein said complementary bit lines extend in opposite directions with respect to said sense amplifier serving as a center, a plurality of said sense amplifiers are arranged in an extending direction of said plurality of word lines and thus said plurality of bit lines including said complementary bit lines are arranged adjacent to each other, and a pitch between said plurality of word lines is narrower than a pitch between said plurality of bit lines.

12. A semiconductor memory device, comprising:

a plurality of memory cells each having a MOS transistor and a capacitor, in which a gate of said MOS transistor is a selection terminal, one of source and drain of said MOS transistor is an I/O terminal, and the other of the source and drain is connected to a storage node of said capacitor;

a plurality of word lines respectively connected to said selection terminals of said plurality of memory cells;

complementary bit lines respectively connected to said I/O terminals of said plurality of memory cells;

a plurality of plate lines respectively connected to terminals on an opposite side of said storage nodes of the capacitors in said plurality of memory cells;

sense amplifiers which are connected to one ends of said complementary bit lines and amplify a voltage difference between said complementary bit lines to latch the amplified voltage;

means which, after one of said plurality of word lines is activated and at the time when said sense amplifier is activated, one of said complementary bit lines is amplified to a first voltage, and the other complementary bit line is amplified to a second voltage lower than said first voltage, drives a plate line corresponding to said one of word lines from a sixth voltage to a seventh voltage higher than said sixth voltage at a second time; and means which reduces the voltage of the bit line amplified to said first voltage to a third voltage lower than said first voltage at a first time and then deactivates said one of word lines.

13. The semiconductor memory device according to claim 12, wherein said first time is approximately simultaneous with said second time.

14. The semiconductor memory device according to claim 12, wherein, after said one of word lines is activated and before said sense amplifier is activated, the plate line corresponding to said one of word lines is driven from said seventh voltage to said sixth voltage.

15. The semiconductor memory device according to claim 12, wherein, after said sense amplifier is activated and before said second time, the plate line corresponding to said one of word lines is driven from said seventh voltage to said sixth voltage.

16. A semiconductor memory device, comprising:

a plurality of memory cells each having a MOS transistor and a capacitor, in which a gate of said MOS transistor is a selection terminal, one of source and drain of said MOS transistor is an I/O terminal, and the other of the source and drain is connected to a storage node of said capacitor;

a plurality of word lines respectively connected to said selection terminals of said plurality of memory cells;

complementary bit lines respectively connected to said I/O terminals of said plurality of memory cells;

sense amplifiers which are connected to one ends of said complementary bit lines and amplify a voltage difference between said complementary bit lines to latch the amplified voltage;

a common source line of PMOS and a common source line of NMOS connected to said sense amplifier; and first, second and third drivers which drive said common source line of PMOS, wherein said sense amplifier includes first and second P channel MOS transistors and first and second N channel MOS transistors, a source of said first P channel MOS transistor is connected to a common source terminal of PMOS, a gate thereof is connected to a second bit line of said complementary bit lines, and a drain thereof is connected to a first bit line of said complementary bit lines, a source of said second P channel MOS transistor is connected to said common source terminal of PMOS, a gate thereof is connected to said first bit line, and a drain thereof is connected to said second bit line, a source of said first N channel MOS transistor is connected to a common source terminal of NMOS, a gate thereof is connected to said second bit line, and a drain thereof is connected to said first bit line, a source of said second N channel MOS transistor is connected to said common source terminal of NMOS, a gate thereof is connected to said first bit line, and a drain thereof is connected to said second bit line, and said first driver is connected to a first power supply voltage, said second driver is connected to a fourth power supply voltage, and said third driver is connected to a fifth power supply voltage.

17. The semiconductor memory device according to claim 16, wherein said fourth power supply voltage is lower than a half of said first power supply voltage.

18. The semiconductor memory device according to claim 16, wherein said first and fourth power supply voltages are generated in a chip by reducing an external power supply voltage by means of a voltage limiter, and said fifth power supply voltage is generated by directly using said external power supply voltage.

19. A semiconductor memory device, comprising:

a plurality of memory cells each having a MOS transistor and a capacitor, in which a gate of said MOS transistor is a selection terminal, one of source and drain of said MOS transistor is an I/O terminal, and the other of the source and drain is connected to a storage node of said capacitor;

a plurality of plate lines respectively connected to nodes of said capacitors on an opposite side of said storage nodes in said plurality of memory cells;

a plurality of word lines respectively connected to said selection terminals of said plurality of memory cells;

complementary bit lines respectively connected to said I/O terminals of said plurality of memory cells;

sense amplifiers which are connected to one ends of the complementary bit lines and amplify a voltage difference between said complementary bit lines to latch the amplified voltage;

a common source line of PMOS which is connected to said sense amplifier and supplies a voltage on a high level side of said complementary bit line;

a common source line of NMOS which is connected to said sense amplifier and supplies a voltage on a low level side of said complementary bit line;

a third MOS transistor in which one of source and drain thereof is connected to a first power supply voltage to be a writing voltage on a high level side of said complementary bit line and the other thereof is connected to said common source line of PMOS;

a fourth MOS transistor in which one of source and drain thereof is connected to a fourth power supply voltage lower than said first power supply voltage and the other thereof is connected to said common source line of PMOS;

a precharge circuit which is connected to said common source line of PMOS and said common source line of NMOS and precharges said common source line of PMOS and said common source line of NMOS to the same voltage; and a plate driver which is connected to said plurality of plate lines and fluctuates voltages of said plurality of plate lines to have predetermined values at the time of writing and reading operations.

20. The semiconductor memory device according to claim 19, wherein said third MOS transistor is a P channel MOS transistor, and said fourth MOS transistor is an N channel MOS transistor.

21. A semiconductor memory device, comprising:

a word line;

complementary bits line composed of two bit lines and have two intersections with said word line;

dynamic-type memory cells each having a MOS transistor and a capacitor, in which a gate of said MOS transistor is connected to said word line, one of source and drain of said MOS transistor is connected to one bit line of said complementary bit lines, and the other of the source and drain is connected to said capacitor; and sense amplifiers arranged on one end sides of said complementary bit lines and composed of a latching circuit which amplifies a voltage difference between said complementary bit lines, wherein said dynamic-type memory cells are provided to both of the two intersections formed by said word line and said complementary bit lines, the other ends of said capacitors in the dynamic-type memory cells provided at said two intersections are connected to the same plate line, and when data is read from said dynamic-type memory cell, said word line is activated, a complimentary signal is generated on said complementary bit lines, and a level of said plate line is driven from a seventh voltage to a sixth voltage lower than said seventh voltage.

22. The semiconductor memory device according to claim 21, wherein, after one of the bit lines of said complementary bit lines is amplified to a first voltage and the other bit line is amplified to a second voltage lower than said first voltage, the level of said plate line is driven from said sixth voltage to said seventh voltage at a second time, and after the bit line amplified to said first voltage at the first time is reduced to a third voltage lower than said first voltage, said word line is deactivated.

23. The semiconductor memory device according to claim 22, wherein said first time is approximately simultaneous with said second time.

* * * * *